United States Patent
Komatsu et al.

(10) Patent No.: US 11,158,376 B2
(45) Date of Patent: Oct. 26, 2021

(54) MEMORY SYSTEM AND METHOD FOR CONTROLLING MEMORY SYSTEM

(71) Applicant: Kioxia Corporation, Minato-ku (JP)

(72) Inventors: Yuki Komatsu, Kawasaki (JP); Yasuyuki Ushijima, Yokohama (JP); Hisaki Niikura, Nakano (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/932,956

(22) Filed: Jul. 20, 2020

(65) Prior Publication Data

US 2021/0082508 A1   Mar. 18, 2021

(30) Foreign Application Priority Data

Sep. 17, 2019   (JP) .............................. JP2019-168162

(51) Int. Cl.
| | | |
|---|---|---|
| *G11C 16/08* | (2006.01) | |
| *G11C 16/30* | (2006.01) | |
| *G11C 16/26* | (2006.01) | |
| *G11C 16/12* | (2006.01) | |

(52) U.S. Cl.
CPC .............. *G11C 16/08* (2013.01); *G11C 16/12* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 7,800,951 B2 | 9/2010 | Sutardja | |
| 8,879,325 B1 | 11/2014 | Bar et al. | |
| 9,189,313 B2 | 11/2015 | Matsuyama et al. | |
| 9,431,118 B1 | 8/2016 | Bar et al. | |
| 2013/0064013 A1* | 3/2013 | Lee ..................... | G11C 11/5628 365/185.03 |
| 2013/0094293 A1* | 4/2013 | Seol ....................... | G06F 11/10 365/185.03 |
| 2013/0314990 A1* | 11/2013 | Harada .............. | G11C 16/3418 365/185.03 |
| 2019/0088314 A1 | 3/2019 | Sato | |

FOREIGN PATENT DOCUMENTS

| | | |
|---|---|---|
| JP | 2012-203957 A | 10/2012 |
| JP | 5252665 B2 | 7/2013 |
| JP | 2019-053806 A | 4/2019 |

\* cited by examiner

*Primary Examiner* — Tan T. Nguyen
(74) *Attorney, Agent, or Firm* — Oblon, McClelland, Maier & Neustadt, L.L.P.

(57) ABSTRACT

According to one embodiment, a memory system includes a memory device and a controller. The controller is configured to instruct to apply, to a first word line, a determination voltage that is based on a first value and a first difference value in a case where it is determined whether or not a first data value has been written in a first memory cell, to instruct to apply, to a second word line, a determination voltage that is based on the first value, the first difference value, and a second difference value in a case where it is determined whether or not the first data value has been written in the second memory cell, and to change the first difference value in a case where a first condition is satisfied.

20 Claims, 19 Drawing Sheets

| | V [Level] | | | | | | |
|---|---|---|---|---|---|---|---|
| | VAD | VBD | VCD | VDD | VED | VFD | VGD |
| REFERENCE VALUE | 25 | 84 | 138 | 195 | 258 | 322 | 392 |

110

| CODEBOOK INDEX | ΔV [Level] | | | | | | |
|---|---|---|---|---|---|---|---|
| | A | B | C | D | E | F | G |
| 0 | 0 | 0 | 0 | 0 | 0 | 0 | 0 |
| 1 | 0 | 1 | -1 | -1 | 0 | 0 | 0 |
| 2 | 0 | -1 | -1 | 0 | -2 | -1 | -1 |
| 3 | 2 | -1 | -1 | 0 | -1 | 1 | -2 |
| ⋮ | ⋮ | ⋮ | ⋮ | ⋮ | ⋮ | ⋮ | ⋮ |
| 255 | 2 | -5 | -7 | -10 | -12 | -14 | -17 |

121

122

| ROW INDEX | ΔV [Level] | | | | | | |
|---|---|---|---|---|---|---|---|
| | A | B | C | D | E | F | G |
| 0 | 10 | 12 | 12 | 12 | 15 | 16 | 11 |
| 1 | 9 | 11 | 12 | 12 | 13 | 14 | 11 |
| 2 | 8 | 9 | 10 | 9 | 11 | 12 | 9 |
| ⋮ | ⋮ | ⋮ | ⋮ | ⋮ | ⋮ | ⋮ | ⋮ |
| 127 | 0 | 0 | 0 | 0 | 0 | 0 | 0 |
| ⋮ | ⋮ | ⋮ | ⋮ | ⋮ | ⋮ | ⋮ | ⋮ |
| 255 | −10 | −5 | −6 | −8 | −10 | −20 | −10 |

METHOD FOR ACQUIRING DETERMINATION VOLTAGE OF REFERENCE BLOCK

| | VAD | VBD | VCD | VDD | VED | VFD | VGD |
|---|---|---|---|---|---|---|---|
| REFERENCE VALUE | 25 | 84 | 138 | 195 | 258 | 322 | 392 |

+

| CODEBOOK INDEX | A | B | C | D | E | F | G |
|---|---|---|---|---|---|---|---|
| 255 | 2 | −5 | −7 | −10 | −12 | −14 | −17 |

+

| ROW INDEX | A | B | C | D | E | F | G |
|---|---|---|---|---|---|---|---|
| 0 | 10 | 12 | 12 | 12 | 15 | 16 | 11 |

| | A | B | C | D | E | F | G |
|---|---|---|---|---|---|---|---|
| ADJUSTED DETERMINATION VOLTAGE | 37 | 91 | 143 | 197 | 261 | 324 | 386 |

FIG. 10

| Group Index | Block Kind | Block Number | Codebook Index |
|---|---|---|---|
| 0 | Reference | 0 | 255 |
| | Difference | 1 | 2 |
| | Difference | 2 | 1 |
| | ⋮ | | |
| | Difference | 31 | 2 |
| 1 | Reference | 32 | 254 |
| | Difference | 33 | 2 |
| | ⋮ | | |
| ⋮ | ⋮ | ⋮ | ⋮ |

123

METHOD FOR ACQUIRING DETERMINATION VOLTAGE OF DIFFERENCE BLOCK

|  | VAD | VBD | VCD | VDD | VED | VFD | VGD |
|---|---|---|---|---|---|---|---|
| REFERENCE VALUE | 25 | 84 | 138 | 195 | 258 | 322 | 392 |

+

| CODEBOOK INDEX | A | B | C | D | E | F | G |
|---|---|---|---|---|---|---|---|
| 255 | 2 | -5 | -7 | -10 | -12 | -14 | -17 |

+

| CODEBOOK INDEX | A | B | C | D | E | F | G |
|---|---|---|---|---|---|---|---|
| 2 | 0 | -1 | -1 | 0 | -2 | -1 | -1 |

+

| ROW INDEX | A | B | C | D | E | F | G |
|---|---|---|---|---|---|---|---|
| 0 | 10 | 12 | 12 | 12 | 15 | 16 | 11 |

|  | A | B | C | D | E | F | G |
|---|---|---|---|---|---|---|---|
| ADJUSTED DETERMINATION VOLTAGE | 37 | 90 | 142 | 197 | 259 | 323 | 385 |

FIG. 18

(a) FIRST CODEBOOK

121A

| CODEBOOK INDEX | ΔV [Level] | | | | | | |
|---|---|---|---|---|---|---|---|
| | A | B | C | D | E | F | G |
| 0 | 0 | 0 | 0 | 0 | 0 | 0 | 0 |
| 1 | 0 | 1 | −1 | −1 | 0 | 0 | 0 |
| 2 | 0 | −1 | −1 | 0 | −2 | −1 | −1 |
| 3 | 2 | −1 | −1 | 0 | −1 | 1 | −2 |
| ⋮ | ⋮ | ⋮ | ⋮ | ⋮ | ⋮ | ⋮ | ⋮ |
| 255 | 2 | −5 | −7 | −10 | −12 | −14 | −17 |

(b) SECOND CODEBOOK

121B

| CODEBOOK INDEX | ΔV [Level] | | | | | | |
|---|---|---|---|---|---|---|---|
| | A | B | C | D | E | F | G |
| 0 | 0 | 0 | 0 | 0 | 0 | 0 | 0 |
| 1 | 0 | 1 | −1 | −1 | 0 | 0 | 0 |
| 2 | 0 | −1 | −1 | 0 | −2 | −1 | −1 |
| 3 | 2 | −1 | −1 | 0 | −1 | 1 | −2 |
| ⋮ | ⋮ | ⋮ | ⋮ | ⋮ | ⋮ | ⋮ | ⋮ |
| 63 | −1 | −2 | −3 | −2 | −4 | −3 | −2 |

| Group Index | Program/Erase Cycle | Error Bit |
|---|---|---|
| 0 | [1000, 2000, 3000] | [1500, 2500, 3500] |
| 1 | [1500, 3000] | [1500, 2500, 3000] |
| ⋮ | ⋮ | ⋮ |

MEMORY SYSTEM AND METHOD FOR CONTROLLING MEMORY SYSTEM

CROSS-REFERENCE TO RELATED APPLICATION

This application is based upon and claims the benefit of priority from Japanese Patent Application No. 2019-168162, filed Sep. 17, 2019; the entire contents of which are incorporated herein by reference.

FIELD

Embodiments described herein relate generally to a memory system and a method for controlling the memory system.

BACKGROUND

A read operation in a memory system is performed by applying a determination voltage to a word line connected to a memory cell. At this time, in a case where a value of the determination voltage is not appropriate in a read operation, error bits of data may increase.

BRIEF DESCRIPTION OF THE DRAWINGS

FIG. 10 is a diagram showing an example of block management information in the first embodiment.

FIG. 18 is a diagram showing an example of common difference value information in a first modification of the first embodiment.

FIG. 19 is a diagram showing an example of tag information in the first embodiment.

DETAILED DESCRIPTION OF THE INVENTION

Figure 1:
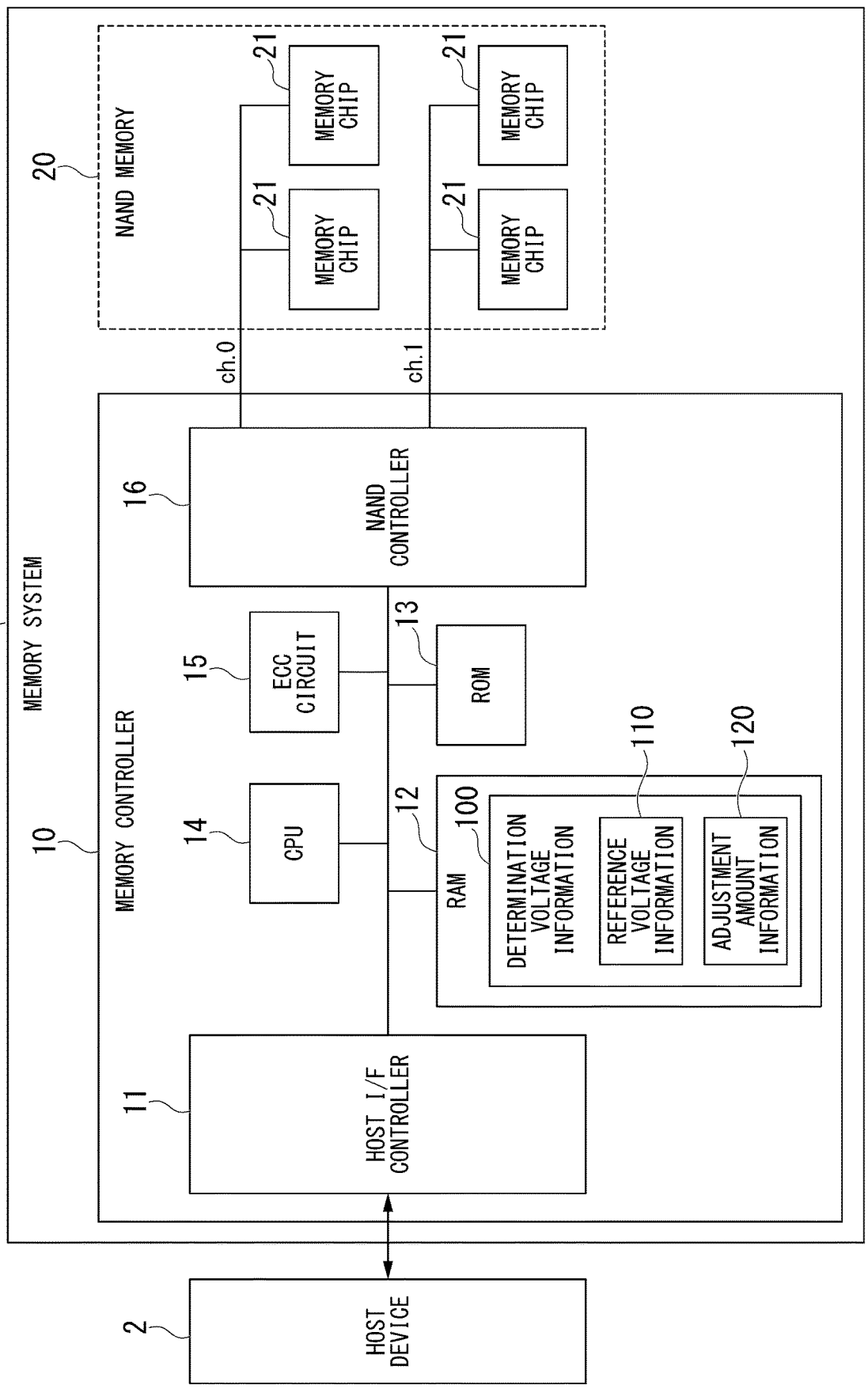
FIG. 1 is a block diagram showing a constitution of a memory system in a first embodiment.

According to one embodiment, a memory system includes a memory device and a controller. The memory device includes a first memory cell, a second memory cell, a first word line, and a second word line. The memory device is configured to write any one data value among one or more data values into each of the first memory cell and the second memory cell. The first word line is connected to the first memory cell. The second word line is connected to the second memory cell. The first memory cell is included in a first physical block. The second memory cell is included in a second physical block. The second physical block is different from the first physical block. The controller is configured to instruct the memory device to apply, to the first word line, a determination voltage that is based on a first value and a first difference value in a case where it is determined whether or not a first data value that is one of the one or more data values has been written in the first memory cell, to instruct the memory device to apply, to the second word line, a determination voltage that is based on the first value, the first difference value, and a second difference value in a case where it is determined whether or not the first data value has been written in the second memory cell, and to change the first difference value in a case where a first condition is satisfied.

Hereinafter, a memory system and a method for controlling the memory system according to embodiments will be described with reference to the drawings. In the following description, constituents having the same or similar functions are designated by the same reference numerals. Additionally, duplicate descriptions of the constituents may be omitted. In the specification, "based on XX" means "based at least on XX" and includes cases based on one or more elements in addition to XX. Further, "based on XX" is not limited to a case in which XX is used directly, and also includes a case in which XX has been calculated or processed. "XX" is an arbitrary element (for example, arbitrary information).

In this specification, "write", "store", and "hold" are used interchangeably. Thus, these terms are interchangeable. In this specification, "connection" is not limited to a mechanical connection and includes an electrical connection. In this specification, "acquisition" is not limited to a case in which information is acquired from outside and also includes a case in which the information is calculated inside a device.

In a memory system including a memory, an appropriate value of a determination voltage used to read data from a memory changes due to an influence of stress such as program disturb, read disturb, or data retention. Stress corresponds to a change in a storage state of a memory cell. Here, in a case where the appropriate value of the determination voltage for each of physical blocks is managed, the appropriate value of the determination voltage for a certain physical block may not be suitable for another physical block and may not be referred to in a read operation for another physical block. Therefore, there is a case in that a process of acquiring an appropriate value for a determination voltage may be repeated according to the number of physical blocks.

Therefore, in a case where a setting of the determination voltage for a certain physical block is updated, the memory system of the embodiment reflects the update in a setting of the determination voltage for another physical block. Thus, values of the determination voltages of a plurality of physical blocks are easily and appropriately set. Therefore, error bits of data is reduced, and it is possible to curb repetition of a process of acquiring an appropriate value of the determination voltage. Hereinafter, such a memory system will be described. However, the present invention is not limited to embodiments described below.

First Embodiment

<1. Overall Constitution of Memory System>

FIG. 1 is a block diagram showing a constitution of the memory system 1 in a first embodiment. The memory system 1 is configured to be connected to a host device 2. The host device 2 is, for example, a server device, a personal computer, or a mobile information processing device. The memory system 1 serves as an external storage device for the host device 2. The host device 2 can issue an access request (a read request, a write request, or the like) to the memory system 1.

The memory system 1 includes a memory controller 10 and a NAND memory 20. The memory controller 10 and the NAND memory 20 are connected by a plurality of channels. The memory controller 10 is an example of a "controller". The NAND memory 20 is an example of a "memory device".

The memory controller 10 includes a host interface controller (a host I/F controller) 11, a random access memory (RAM) 12, a read only memory (ROM) 13, a central processing unit (CPU) 14, an error correcting code (ECC) circuit 15, and a NAND controller 16. These functional units are connected to each other by a bus. For example, the memory controller 10 is configured by a system on a chip (SoC) in which these constitutions are integrated into one chip. However, some of these functional units may be provided outside the memory controller 10.

The host I/F controller 11 performs control of a communication interface between the host device 2 and the memory system 1 and control of data transmission between the host device 2 and the RAM 12 under control of the CPU 14.

The RAM 12 is, for example, a synchronous dynamic random access memory (SDRAM) or a static random access memory (SRAM) but is not limited thereto. The RAM 12 serves as a buffer for transmitting data between the host device 2 and the NAND memory 20. Further, the RAM 12 provides a work area for the CPU 14. A firmware (program) stored in the ROM 13 is loaded into the RAM 12 when the memory system 1 is operated.

In the present embodiment, when the memory system 1 is operated, for example, determination voltage information 100 stored in a memory chip 21 of the NAND memory 20 is loaded into the RAM 12. The determination voltage information 100 is setting information used for determining values of the determination voltages to be applied to word lines WL, which will be described later, in a read operation for the NAND memory 20. The determination voltage information 100 includes reference voltage information 110 and adjustment amount information 120. The determination voltage information 100 will be described later in detail.

In the embodiment, the memory controller 10 calculates the value of the determination voltage to be applied to each of the word lines WL based on the determination voltage information 100 and instructs the NAND memory 20 to apply the determination voltage having the calculated value. Here, instead of the value of the determination voltage being calculated by the memory controller 10, a reference value of the determination voltage may be stored in the NAND memory 20, a difference value (a group difference value, a block difference value, or the like, which will be described later) with respect to the reference value may be instructed from the memory controller 10 to the NAND memory 20, and the value of the determination voltage may be calculated and applied by the NAND memory 20.

The CPU 14 is an example of a hardware processor. The CPU 14 controls the memory controller 10 by executing, for example, firmware loaded on the RAM 12. For example, the CPU 14 controls operations related to writing, reading, and erasing of data described below. Also, a plurality of CPUs 14 may be provided for each of operations.

The ECC circuit 15 performs encoding for error correction on data to be written to the NAND memory 20 (hereinafter, also referred to as "write data"). When data read from the NAND memory 20 (hereinafter, also referred to as "read data") includes an error, the ECC circuit 15 performs the error correction on the read data based on the error correction code given at the time of a write operation.

The NAND controller 16 controls each of channels (ch.0 and ch.1). The NAND controller 16 controls data transmission between the RAM 12 and the NAND memory 20 under the control of the CPU 14.

The NAND memory 20 has a plurality of (here, four) memory chips 21 as nonvolatile semiconductor memories. In the embodiment, the memory controller 10 has two channels (ch.0 and ch.1). The memory controller 10 may have one or three or more channels. In the example shown in FIG. 1, two memory chips 21 are connected to each of the channels. Three or more memory chips 21 may be connected to each of the channels.

Each of the channels includes an I/0 signal line, a control signal line, a chip enable (CE) signal line, and a ready (RY)/busy (BY) signal line. The I/O signal line transmits data, addresses, and various instructions. The memory controller 10 transmits a read instruction, a write instruction, and an erase instruction to the memory chip 21 via the I/O signal line. The control signal line includes a write enable (WE) signal line, a read enable (RE) signal line, a command latch enable (CLE) signal line, an address latch enable (ALE) signal line, a write protect (WP) signal line, and the like. The CE signal line transmits a signal indicating that the memory chip is being selected. The RY/BY signal line indicates whether the NAND memory 20 is in operation or not by a signal level, for example, indicates a ready state (RY) which corresponds to being in non-operation by an H level, and indicates a busy state (BY) which corresponds to being in operation by an L level.

<2. Constitution of Memory Chip>

Figure 2:
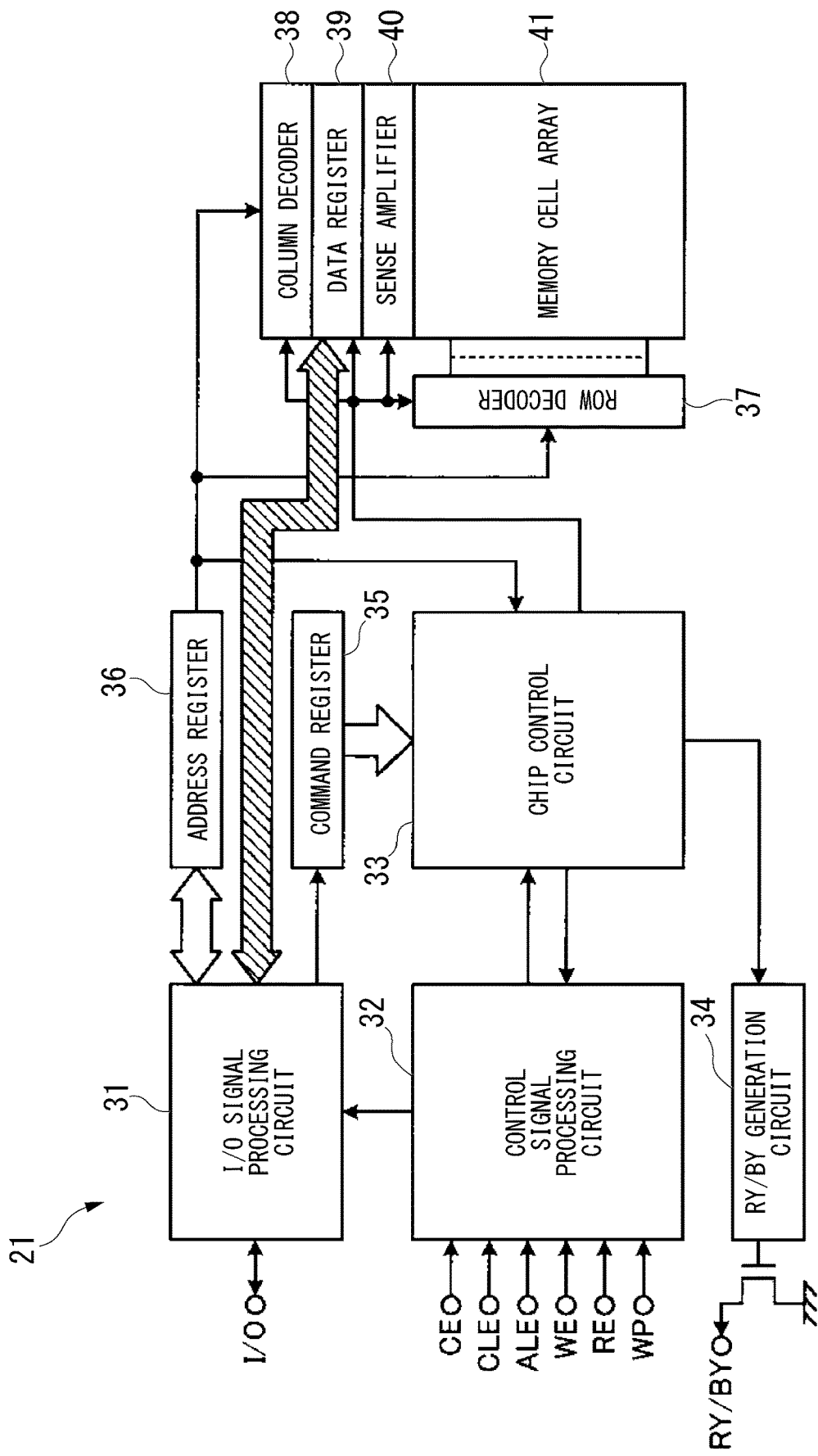
FIG. 2 is a block diagram showing a constitution of a memory chip in the first embodiment.

FIG. 2 is a block diagram showing a constitution of the memory chip 21. The memory chip 21 includes, for example, an I/O signal processing circuit 31, a control signal processing circuit 32, a chip control circuit 33, an RY/BY generation circuit 34, a command register 35, an address register 36, a row decoder 37, a column decoder 38, a data register 39, a sense amplifier 40, and a memory cell array 41.

The I/O signal processing circuit 31 is a buffer circuit which transmits and receives an I/O signal between the memory controller 10 and the memory chip 21. A command, an address identifying an access destination, and data which are latched by the I/O signal processing circuit 31 are respectively distributed and stored in the command register 35, the address register 36, and the data register 39.

The addresses stored in the address register 36 include a chip number, a row address, and a column address. The chip number is an identification information for distinguishing the memory chip 21. The chip number, the row address, and the column address are respectively read by the chip control circuit 33, the row decoder 37, and the column decoder 38.

The control signal processing circuit 32 receives a control signal and performs, based on the received control signal, distribution of registers for storing destinations of I/O signals received by the I/O signal processing circuit 31. Further, the control signal processing circuit 32 transfers the received control signal to the chip control circuit 33.

The chip control circuit 33 is a circuit which performs state transition based on various control signals received via the control signal processing circuit 32. The chip control circuit 33 controls an operation of the memory chip 21. The RY/BY generation circuit 34 transitions a state of the RY/BY signal line between a ready state (RY) and a busy state (BY) under the control of the chip control circuit 33.

In the read operation, the sense amplifier 40 senses a state of the memory cell MT (refer to FIG. 3) included in the memory cell array 41 and generates read data based on the sensed state. The sense amplifier 40 stores the generated read data in the data register 39. The read data stored in the data register 39 is sent to the I/O signal processing circuit 31 via the data line and is then transferred from the I/O signal processing circuit 31 to the memory controller 10.

The memory cell array 41 includes a plurality of memory cells MT and stores data. More specifically, the memory cell array 41 includes a plurality of physical blocks BLK (refer to FIG. 3). Each of the physical blocks BLK includes the plurality of memory cells MT. The physical block BLK is a minimum unit for erasing data. That is, all data stored in one physical block BLK are erased collectively. Hereinafter, the "physical block" is simply referred to as a "block".

<3. Constitution of Memory Cell Array>

Figure 3:
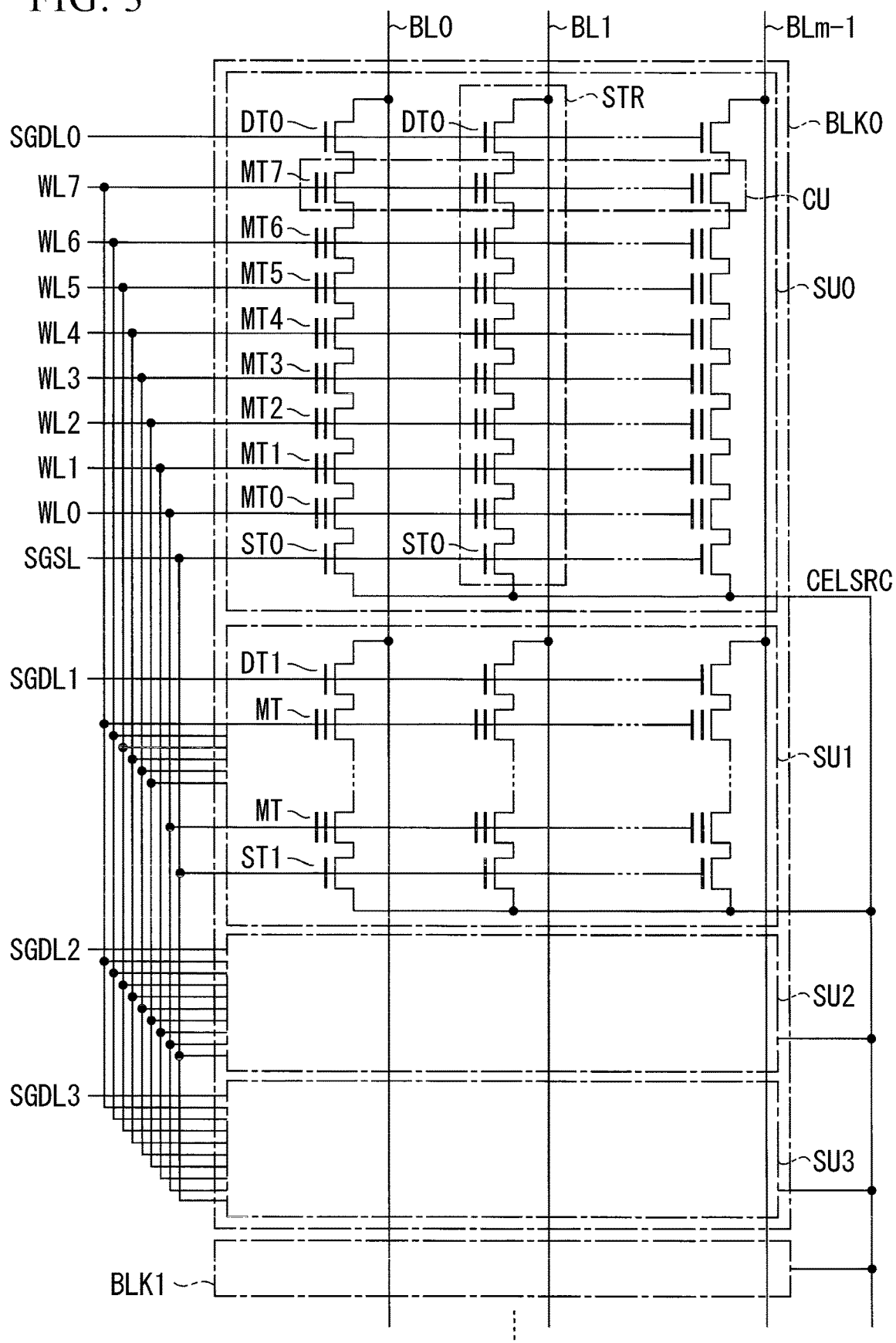
FIG. 3 is a diagram showing an example of a part of a constitution of a memory cell array in the first embodiment.

FIG. 3 is a diagram showing an example of a part of a constitution of the memory cell array 41. The memory cell array 41 is, for example, a so-called three-dimensional NAND memory in which the plurality of memory cells MT are disposed three-dimensionally. The memory cell array 41 includes a plurality of blocks BLK (BLK0, BLK1, . . . ). For example, the memory cell array 41 has hundreds to thousands of blocks BLK.

As shown in FIG. 3, each of m (in is a natural number) bit lines BL (BL0 to BLm−1) is connected to a plurality of (for example, four) strings STR in each of the blocks BLK. Each of the strings STR includes one first selection gate transistor ST (ST0 to ST3), a plurality of memory cells MT (MT0 to MT7), and one second selection gate transistor DT (DT0 to DT3). The first selection gate transistor ST, the plurality of memory cells MT, and the second selection gate transistor DT are connected in series between a source line CELSRC and one bit line BL in this order. The plurality of (m) strings STR respectively connected to a plurality of different bit lines BL (BL0 to BLm−1) constitute one string unit SU. Each of the blocks BLK includes a plurality of (for example, four) string units SU (SU0 to SU3).

A control gate electrode of the first selection gate transistor ST is connected to a first selection gate line (a source side selection gate line) SGSL. The first selection gate line SGSL is a control signal line which controls the control gate electrode of the first selection gate transistor ST. The first selection gate transistor ST selectively connects the plurality of memory cells MT to the source line CELSRC based on a voltage applied through the first selection gate line SGSL. The first selection gate line SGSL may be independently connected in each of the string units SU (SU0 to SU3).

A control gate electrode of the second selection gate transistor DT is connected to a second selection gate line (a drain side selection gate line) SGDL (SGDL0 to SGDL3). The second selection gate line SGDL is a control signal line which controls the control gate electrode of the second selection gate transistor DT. The second selection gate transistor DT selectively connects the plurality of memory cells MT to the bit line BL based on a voltage applied through the second selection gate line SGDL.

Each of the memory cells (memory cell transistors) MT is constituted of a metal oxide semiconductor field effect transistor (MOSFET) having a laminated gate structure. The laminated gate structure includes, for example, a floating gate formed with a tunnel oxide film interposed therebetween, and a control gate electrode formed on the floating gate with a gate insulating film interposed therebetween. A threshold voltage of the memory cell MT changes according to the amount of charge accumulated in the floating gate. In the memory cell MT, positive charges are injected into the floating gate by writing, and the positive charges are drawn out of the floating gate for erasing. Each of the memory cells MT can have any one data value of two or more data values written therein. Each of the memory cells MT stores one data value of one or more data values in a nonvolatile manner according to a difference in the threshold voltage.

In each of the blocks BLK, the control gate electrode of each of the memory cells MT is connected to a corresponding word line WL. For example, word lines WL0 to WL7 are respectively connected to the control gate electrodes of the memory cells MT0 to MT7. Each of the word lines WL is a control signal line which selects a group of memory cells MT arranged in one line (one row) in the memory cell array 41 and is commonly connected to the group of memory cells MT arranged in one line. Each of the memory cells MT is provided at an intersection of the word line WL and the bit line BL (BL0 to BLm−1). Reading or writing of the memory cell MT becomes possible by applying a certain voltage to the word line WL (hereinafter, also referred to as "selected word line WL") connected to the memory cell MT in which the reading or writing is performed. The reading and writing of the memory cell MT will be described later.

In each of the blocks BLK, the plurality of memory cells MT included in the different strings STR are commonly connected to the word line WL corresponding to the same address. A set of the plurality of memory cells MT which share the same word line WL is referred to as a cell unit CU. In the plurality of memory cells MT included in one cell unit CU, data is written collectively, and the data is read collectively. A storage space of one cell unit CU includes one page or a plurality of pages.

In the embodiment, the memory cells MT0 and MT1 included in the block BLK0 are respectively examples of a "first memory cell" and a "third memory cell". The word lines WL0 and WL1 connected to the memory cells MT0 and MT1 in the block BLK0 are respectively examples of a "first word line" and a "third word line".

Similarly, MT0 and MT1 included in the block BLK1 are respectively examples of a "second memory cell" and a "fourth memory cell". The word lines WL0 and WL1 connected to the memory cells MT0 and MT1 in the block BLK1 are respectively examples of a "second word line" and a "fourth word line". Further, MT0 included in the block BLK2 (refer to FIG. 5) is an example of a "fifth memory cell" and another example of "fourth memory cell". The word line WL0 connected to the memory cell MT0 in the block BLK2 is an example of a "fifth word line" and another example of "fourth word line".

Further, the memory cell MT0 included in one block BLK belonging to a group G (refer to FIG. 5) different from the above-described blocks BLK0, BLK1, and BLK2 is an example of a "sixth memory cell". The word line WL0 connected to this memory cell MT0 is an example of a "sixth word line". The group G which includes the blocks BLK0, BLK1, and BLK2 is an example of a "first group". The group G which includes the block BLK including the sixth memory cell is an example of a "second group".

The memory system 1 may be constituted to be able to store a plurality of bit values in each of the memory cells MT. For example, in a case where each of the memory cells MT can store an n-bit value (n≥2), a storage capacity per word line WL is equal to a size of n pages. Here, as an example, a case in which each of the memory cells MT is operated in a triple level cell (TLC) mode in which a 3-bit value is stored will be described.

In the triple level cell (TLC) mode, three pages of data can be stored in each of the word lines WL. Among the three pages constituted by one word line WL, the page on which the writing is performed first is referred to as a lower page, the page on which the writing is performed after the lower page is referred to as a middle page, and the page on which the writing is performed after the middle page is referred to as an upper page. There may be a mode in which a program (that is, the writing) is executed collectively on some or all of the plurality of pages constituted by one word line WL.

<4. Threshold Distribution of Memory Cell>

Figure 4:
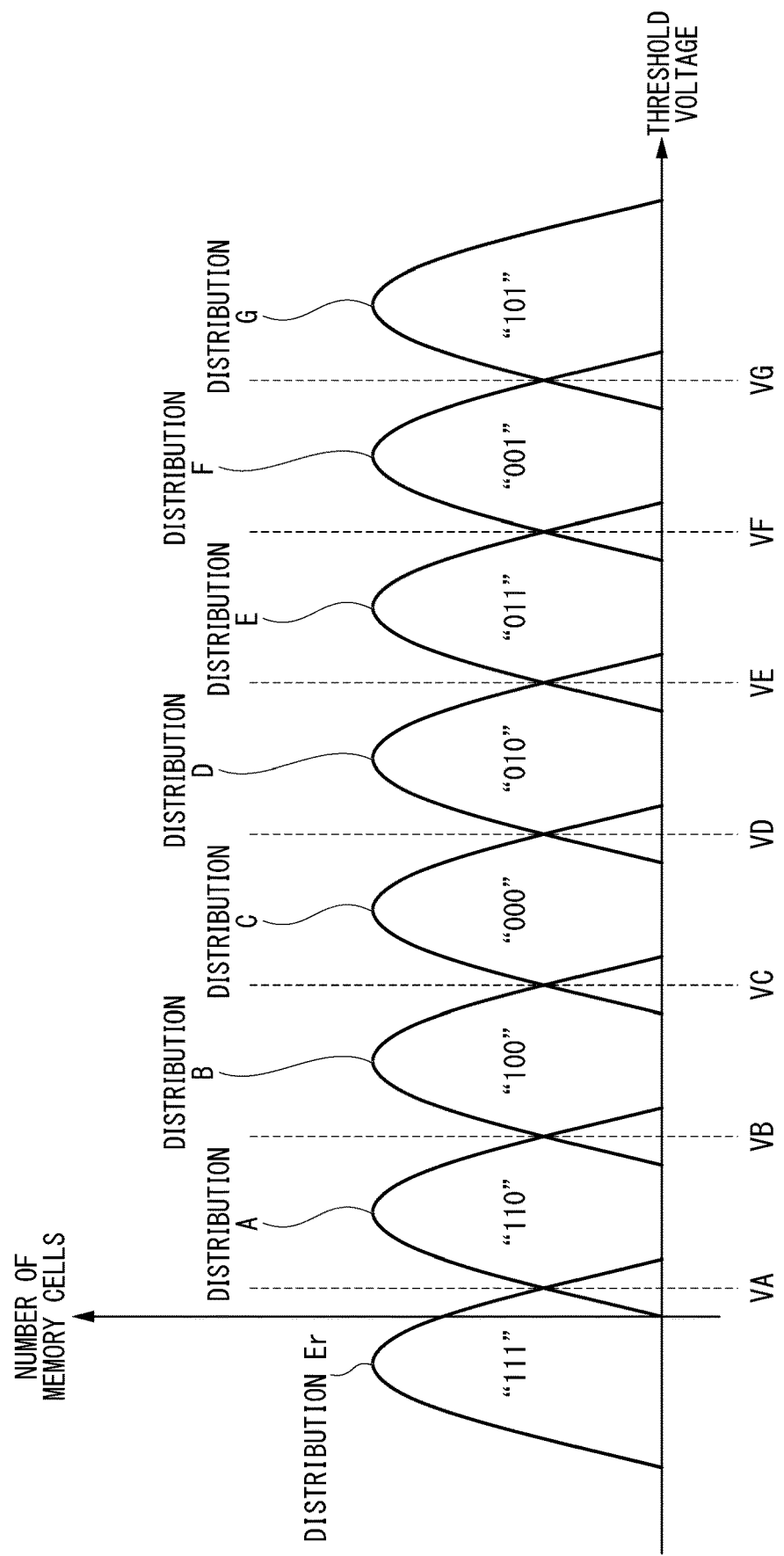
FIG. 4 is a diagram showing a threshold distribution of memory cells in the first embodiment.

FIG. 4 is a diagram showing a threshold distribution of the memory cells MT. In FIG. 4, a horizontal axis indicates the threshold voltages of the memory cells MT, and a vertical axis indicates the number of memory cells MT which indicates a certain hit value (a data value). In a case where each of the memory cells MT is operated in the triple level cell (TLC) mode, the threshold distribution of the memory cell MT includes eight lobs as shown in FIG. 4.

According to the triple level cell (TLC) mode, each of the memory cells MT can store octal value data "xyz" which is defined by data "x" belonging to the upper page, data "y" belonging to the middle page, and data "z" belonging to the lower page. Values of the data "x", the data "y", and the data "z" are code "0" or code "1".

The threshold voltage of each of the memory cells MT is controlled such that it belongs to one of eight groups of distribution Er, distribution A, distribution B, distribution C, distribution D, distribution E, distribution F, and distribution G. A correspondence between each of the distributions and a data value of the octal value data "xyz" is set in advance. For example, a data value "111" may be assigned to the distribution Er. A data value "110" may be assigned to the distribution A. The respective data values shown in FIG. 4 are assigned to the distributions B to G, respectively. The correspondence between each of the distributions and the data values is not limited to the above.

Here, the row decoder 37, the column decoder 38, the data register 39, and the sense amplifier 40 of the NAND memory 20 will be additionally described with reference to FIG. 2. The row decoder 37, the column decoder 38, the data register 39, and the sense amplifier 40 are a part of a peripheral circuit for the memory cell array 41. The peripheral circuit performs access (reading, writing, or erasing) to the memory cell array 41 based on control by the chip control circuit 33.

For example, in the write operation, the column decoder 38 selects and activates a bit line BL corresponding to a column address. The sense amplifier 40 sets a potential of the bit line BL selected by the column decoder 38 to 0 volts. The row decoder 37 applies a programming pulse (that is, a pulse in which a voltage gradually increases in each cycle) to the word line WL corresponding to a row address. Therefore, charge is injected into the floating gate of the memory cell MT located at the intersection of the selected bit line BL and the selected word line WL, and as a result, the threshold voltage of the floating gate increases. The sense amplifier 40 checks whether or not the threshold voltage of the memory cell MT to be written in has reached a voltage corresponding to the data stored in the data register 39 in each cycle of the programming pulse. The row decoder 37 continues to apply the programming pulse until the threshold voltage of the memory cell MT reaches a voltage corresponding to the data value to be written according to a result of the checking by the sense amplifier 40.

On the other hand, in the read operation, the sense amplifier 40 pre-charges the bit line BL with a power supply potential Vcc. The row decoder 37 sequentially applies a plurality of types of determination potentials (threshold determination voltages and read voltages) which identifies a distribution for each of the data values ("111", "110", "100", "000", "010", "011", "001", and "101") to the selected word line WL. The row decoder 37 applies a transfer potential to the unselected word lines WL and sets the memory cells MT belonging to the unselected word lines WL to be in a conductive state. The sense amplifier 40 determines the data value stored in the target memory cell MT by detecting which determination voltage is applied when the charge stored by the pre-charging flows out to the source line CELSRC.

For example, as shown in FIG. 4, in a case where the determination voltage VA is set between the distribution Er and the distribution A, the memory cell MT having a threshold voltage lower than the determination voltage VA is determined to be in the distribution Er. Further, in a case where the determination voltage VB is set between the distribution A and the distribution B, the memory cell MT having a threshold voltage lower than the determination voltage VB is determined to be in the distribution A. Similarly, as shown in FIG. 4, the determination voltage may be set between two adjacent distributions, and the memory cell MT having a threshold voltage lower than the determination voltage is determined to have the distribution having a lower threshold voltage among the two distributions. Hereinafter, in a case where the determination voltages VA to VG are not distinguished, they are simply referred to as "determination voltages V".

5. Management of Determination Voltage

5.1 Overview of Compressed Storage of Determination Voltage

Next, management of the determination voltage V will be described. An appropriate value of the determination voltage V differs for each of the blocks BLK and also differs for each of the word lines WL in the same block BLK. Further, the appropriate value of the determination voltage V changes under the influence of stress such as program disturb, read disturb, or data retention. Therefore, preferably, setting information of the determination voltage V which reflects the latest appropriate value is stored separately for each of the blocks BLK and more specifically, that is stored separately for each of the word lines WL. However, the number of blocks BLK and the number of word lines WL included in one memory cell array 41 are enormous. Therefore, a large storage capacity is required to separately store the setting information of the determination voltage V for each of the blocks BLK and each of the word lines WL.

Therefore, in the embodiment, the setting information of the determination voltages V of the plurality of blocks BLK and the plurality of word lines WL is compressed, and thus the setting information of the determination voltages V can be stored with a relatively small storage capacity. Specifically, in the embodiment, one or more (for example, a plurality of) groups G are set as a management unit of the determination voltage V. Each of the groups G is associated with a plurality of blocks BLK. The plurality of blocks BLK included in each of the groups G can be divided into one reference block RB and a plurality of remaining difference blocks DR. Then, each of the determination voltages V (VA to VG) of each of the difference blocks DB is managed and updated in association with each of the determination voltages V (VA to VG) of the reference block RB. Hereinafter, these details will be described in detail.

5.2 Setting of Group

Figures 5, 6, 7:
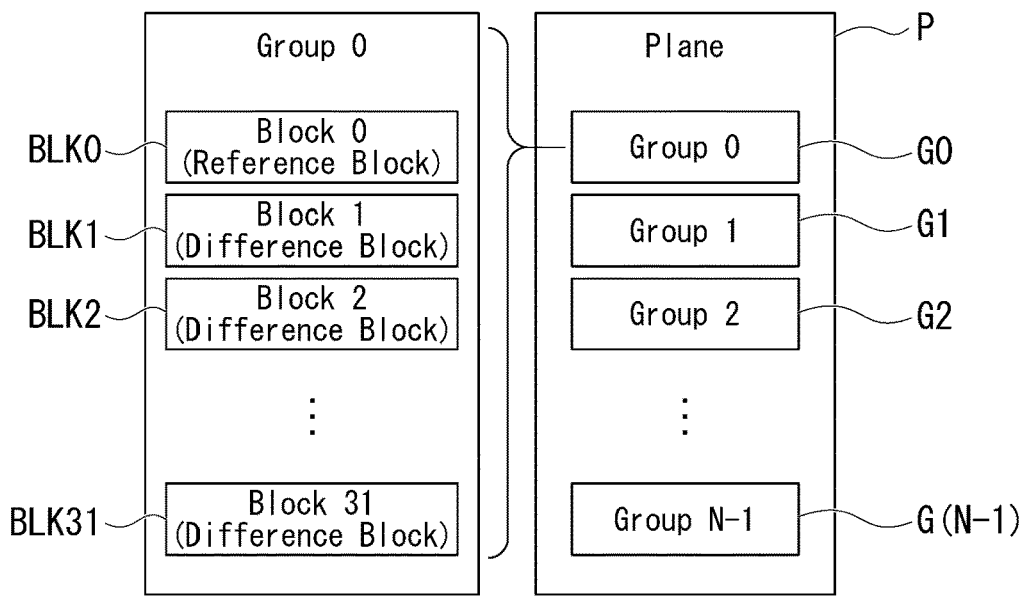
FIG. 5 is a diagram conceptually showing setting of group in the first embodiment.
FIG. 6 is a diagram showing an example of reference voltage information in the first embodiment.
FIG. 7 is a diagram showing an example of common difference value information in the first embodiment.

FIG. 5 is a diagram conceptually showing setting of the group G. In the embodiment, a plurality of groups G are set in the memory cell array 41. In the example shown in FIG. 5, a plurality of groups G (G0 to GN-1 (N is a natural number of 2 or more)) are set in one plane P of the memory cell array 41. The plane P is, for example, a region which can be continuously accessed through one channel in the memory cell array 41. A plurality of blocks BLK corresponding to logical address destinations designated for reading/writing may be set to the same group G.

Each of the groups G includes a plurality of blocks BLK for which the determination voltages V are managed collectively. In each of the groups G, one reference block RB and a plurality of difference blocks DB are set. The reference block RB is a block BLK which serves as a reference for managing the determination voltages V in each of the groups G. The difference block DB is a block BLK in which the determination voltage V is managed by a difference value with respect to the determination voltage V of the reference block RB in each of the groups G.

In the example shown in FIG. 5, each of the groups G includes 32 blocks BLK. In this case, each of the groups G includes one reference block RB and 31 difference blocks DB. For example, in the group G0, the block BLK0 is set as the reference block RB, and the blocks BLK1 to BLK31 are set as the difference blocks DB.

5.3 Management of Determination Voltage of Reference Block

First, a method for managing the determination voltage V of the reference block RB will be described. The determination voltage V of the reference block RB is managed using, for example, one or more difference values of the determination voltage V with respect to default reference values VAD to VGD.

FIG. 6 is a diagram showing an example of the reference voltage information 110 included in the determination voltage information 100 (refer to FIG. 1). In FIG. 6, the values of VAD to VGD indicate reference values (for example, initial setting values) of the determination voltages VA to VG, respectively. Each of the values is a value which indicates a reference value of any one of the determination voltages VA to VG and is indicated by a relative level. For example, the reference voltage information 110 is set in common (having the same value) for the plurality of memory chips 21. The reference voltage information 110 may be provided separately for each of the memory chips 21, may be provided separately for each of the planes P, or may be provided separately for each of the groups G.

FIG. 7 is a diagram showing an example of common difference value information 121 included in the adjustment amount information 120 of the determination voltage information 100 (refer to FIG. 1). The common difference value information 121 indicates candidates for a difference value (an adjustment amount, a shift amount) ΔV of the determination voltage V with respect to a predetermined reference. For example, the common difference value information 121 indicates candidates for difference values ΔV of the determination voltages V with respect to the default reference values VAD to VGD of the determination voltages V (or the determination voltages V of the reference block RB as described later). The values A to G in FIG. 7 indicate difference values corresponding to the determination voltages VA to VG, respectively. These difference values are used to correct the values of the determination voltages VA to VG, for example, by being added to the reference values VAD to VGD (or other values) of the determination voltages VA to VG. The difference values included in the common difference value information 121 are commonly used for all the word lines WL included in the target block BLK. The number of bits which indicate each of these difference values is smaller than the number of bits which indicate each of the reference values VAD to VGD of the determination voltages V included in the reference voltage information 110, for example.

Here, the common difference value information 121 in the embodiment is not necessarily a difference value which allows the determination voltages VA to VG to coincide with optimum values of the determination voltages VA to VG. The common difference value information 121 is acquired by modeling dominant deviation patterns (hereinafter, also referred to as a "shift patterns") which occur in the determination voltages VA to VG. In the embodiment, 256 shift patterns are acquired and registered in advance as candidates as dominant shift patterns which occur in the determination voltages VA to VG. These shift patterns can be acquired in advance by, for example, any one of various mathematical methods, machine learning, or experiments/simulations. For example, these shift patterns may be acquired by performing a data read operation against the plurality of blocks BLK in advance and applying a median cut method to a database in which a determination voltage V and a bit error rate at that time are recorded.

Hereinafter, the common difference value information 121 is referred to as "codebook 121" for convenience of description. The codebook 121 is a table in which combinations (the shift patterns) of difference values corresponding to the determination voltages VA to VG are registered in association with identification numbers called codebook indexes. The memory controller 10 is configured to acquire the combinations of the difference values corresponding to the determination voltages VA to VG by designating the codebook index. In the embodiment, the number of shift patterns registered in the codebook 121 is 256. Accordingly, the memory controller 10 can acquire various combinations of the difference values corresponding to the determination voltages VA to VG with 8-bit data.

In the embodiment, for example, the codebook 121 is provided in common for the plurality of memory chips 21. The codebook 121 may be provided separately for each of the memory chips 21 or may be provided separately for each of the planes P. Which reference block RB (that is, which block BLK) is associated with which codebook index is registered and managed in block management information 123 (refer to FIG. 10) which will be described later.

Figures 8, 9:
FIG. 8 is a diagram showing an example of row difference value information in the first embodiment.
FIG. 9 is a diagram showing a method for acquiring a determination voltage applied to one word line included in a reference block in the first embodiment.

FIG. 8 is a diagram showing an example of row difference value information 122 included in the adjustment amount information 120 of the determination voltage information 100 (refer to FIG. 1). The row difference value information 122 indicates difference values (adjustment amounts, shift amounts) ΔV of the determination voltages V for each of the plurality of word lines WL in each of the blocks BLK. The values A to G in FIG. 8 indicate difference values corresponding to the determination voltages VA to VG, respectively. These difference values are used to correct the values of the determination voltages VA to VG for each of the word lines WL by being added to, for example, the determination voltages VA to VG of each of the blocks BLK which are acquired using the codebook 121.

Here, the row difference value information 122 is acquired by modeling dominant deviation patterns (hereinafter, also referred to as an "offset patterns" for distinction) of the determination voltages VA to VG generated for each of the word lines WL in each of the blocks BLK. In the embodiment, 256 offset patterns are acquired and registered in advance as dominant offset patterns which occur in the determination voltages VA to VG. These offset patterns may be acquired in advance by, for example, any one of various mathematical methods, machine learning, or experiments/simulations. For example, these offset patterns can be acquired by applying the determination voltage V to the plurality of word lines WL, performing a data read operation in advance and applying a median cut method to a database in which a determination voltage V and a bit error rate at that time are recorded.

The row difference value information 122 is a table in which combinations (the offset patterns) of adjustment amounts corresponding to the determination voltages VA to VG are registered in association with identification numbers called row indexes. The memory controller 10 is configured to acquire the combinations of the difference values corresponding to the determination voltages VA to VG by designating the row index corresponding to the target word line WL. In the embodiment, the number of offset patterns registered in the row difference value information 122 is 256. Accordingly, the memory controller 10 can acquire various combinations of the difference values corresponding to the determination voltages VA to VG with 8-bit data.

Here, the row difference value information 122 has a reference row (the reference word line WL) which serves as a reference point for adjustment. In the example shown in FIG. 8, a row index 127 corresponds to the reference row. The shift pattern registered in the above-described codebook 121 is a shift pattern corresponding to the reference row. Accordingly, the determination voltage V corresponding to each of the word lines WL is acquired by further adding the difference value registered in the row difference value information 122 to the difference value registered in the codebook 121.

In the embodiment, the row difference value information 122 is provided, for example, in common for the plurality of memory chips 21. The row difference value information 122 may be provided separately for each of the memory chips 21, may be provided separately for each of the planes P, may be provided separately for each of the groups G, and may be provided separately for each of the blocks BLK. In the row difference value information 122, the row index corresponds to, for example, the identification number of the word line WL (hereinafter, also referred to as "word line ID"). In other words, in the row difference value information 122, the plurality of offset patterns are mechanically arranged and registered in the order of the word line IDs. Thus, the offset pattern corresponding to the word line WL can be acquired based on the word line ID of a certain word line WL. Alternatively, which word line WL is associated with which row index may be registered and managed in management information (not shown) included in the adjustment amount information 120.

FIG. 9 is a diagram showing a method for acquiring the determination voltages VA to VG applied to the word line WL0 of the reference block RB of the group G0. The example shown in FIG. 9 is an example in which the reference block RB of the group G0 is registered in association with a codebook index 255, and the word line WL0 is registered in association with a row index 0.

In this case, the memory controller 10 adds difference values [2, −5, −7, −10, −12, −14, and −17] acquired by designating the codebook index 255 with reference to the codebook 121 and also adds difference values [10, 12, 12, 12, 15, 16, and 11] acquired by designating the row index 0 with reference to the row difference value information 122 to the reference values [25, 84, 138, 195, 258, 322, and 392] acquired by referring to the reference voltage information 110. Thus, the memory controller 10 acquires the determination voltages VA to VG indicated by [37, 91, 143, 197, 261, 324, and 386].

<5.4 Management of Determination Voltage of Difference Block>

Next, a method for managing the determination voltage V of the difference block DB will be described. In the embodiment, the determination voltage V of the difference block DB is managed using a difference value with respect to the determination voltage V of the reference block RB belonging to the same group G.

FIG. 10 is a diagram showing an example of the block management information 123 included in the adjustment amount information 120 of the determination voltage information 100 (refer to FIG. 1). In the block management information 123, each of the blocks BLK (the reference block RB and the difference block DB) is registered in association with a group index of the group G to which its own block BLK belongs. Therefore, the memory controller 10 can identify the reference block RB included in the same group G as the target difference block DB by referring to the block management information 123.

In the embodiment, the determination voltages V of the difference block DB are not managed by direct difference values of the determination voltages V with respect to the reference values VAD to VGD but are managed using additional difference values with respect to the shift of the determination voltages V of the reference block RB belonging to the same group G (that is, the determination voltages V corrected by the codebook 121). The "additional difference values" may be, for example, a shift pattern registered in the same codebook 121 as the reference block RB, or may be a shift pattern registered in a codebook 121 different from the reference block RB. In the embodiment, an example in which the difference values of the difference block DB are managed using the shift pattern registered in the same codebook 121 as the reference block RB will be described. An example in which the difference values of the difference block DB are managed using the shift pattern registered in the codebook 121 different from the reference block RB will be described later as a modification of the first embodiment. In the block management information 123 shown in FIG. 10, each of the blocks BLK (the reference block RB and the difference block DB) is registered in association with a codebook index which indicates a shift pattern of each of the blocks BLK (a shift pattern with respect to reference values in the case of the reference block RB, and a shift pattern with respect to the reference block RB in the case of the difference block DB).

In the embodiment, the memory controller 10 is configured to acquire the shift pattern (the combination of the difference values corresponding to the determination voltages VA to VG) of each of the difference blocks DB with respect to the determination voltages V of the reference block RB by designating the codebook index with reference to the codebook 121. In other words, such a shift pattern is also registered as a part of the codebook 121. The memory controller 10 acquires the determination voltages V of each of the difference blocks DB by adding the shift pattern of each of the difference blocks DB to the determination voltages V of the reference block RB belonging to the same group G. Referring to the row difference value information 122 when the determination voltages V of each of the word lines WL of the difference block DB are acquired is similar to the case of the reference block RB.

Figure 11:
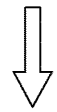
FIG. 11 is a diagram showing a method for acquiring a determination voltage applied to one word line included in a difference block in the first embodiment.

FIG. 11 is a diagram showing a method for acquiring the determination voltages VA to VG applied to the word line WL0 of one difference block DB (here, the block BLK1) of the group G0. FIG. 11 shows an example which the reference block RB (the block BLK0) of the group G0 is registered in association with the codebook index 255, one difference block DB (the block BLK1) of the group G0 is registered in association with the codebook index 2, and the word line WL0 is registered in association with the row index 0.

In the case, the memory controller 10 adds difference values [2, −5, −7, −10, −12, −14, and −17] of the reference block RB of the same group G acquired by designating the codebook index 255 with reference to the codebook 121, difference values [0, −1, −1, 0, −2, −1, and −1] of the difference block DB acquired by designating the codebook index 2 with reference to the codebook 121 and difference values [10, 12, 12, 12, 15, 16, and 11] acquired by designating the row index 0 with reference to the row difference value information 122 to the reference values [25, 84, 138, 195, 258, 322, and 392] acquired by referring to the reference voltage information 110. Thus, the memory controller 10 acquires the determination voltages VA to VG indicated by [37, 90, 142, 197, 259, 323, and 385].

<6. Control Flow>
<6.1 Processing Relating to Acquisition of Determination Voltage V>

Figure 12:
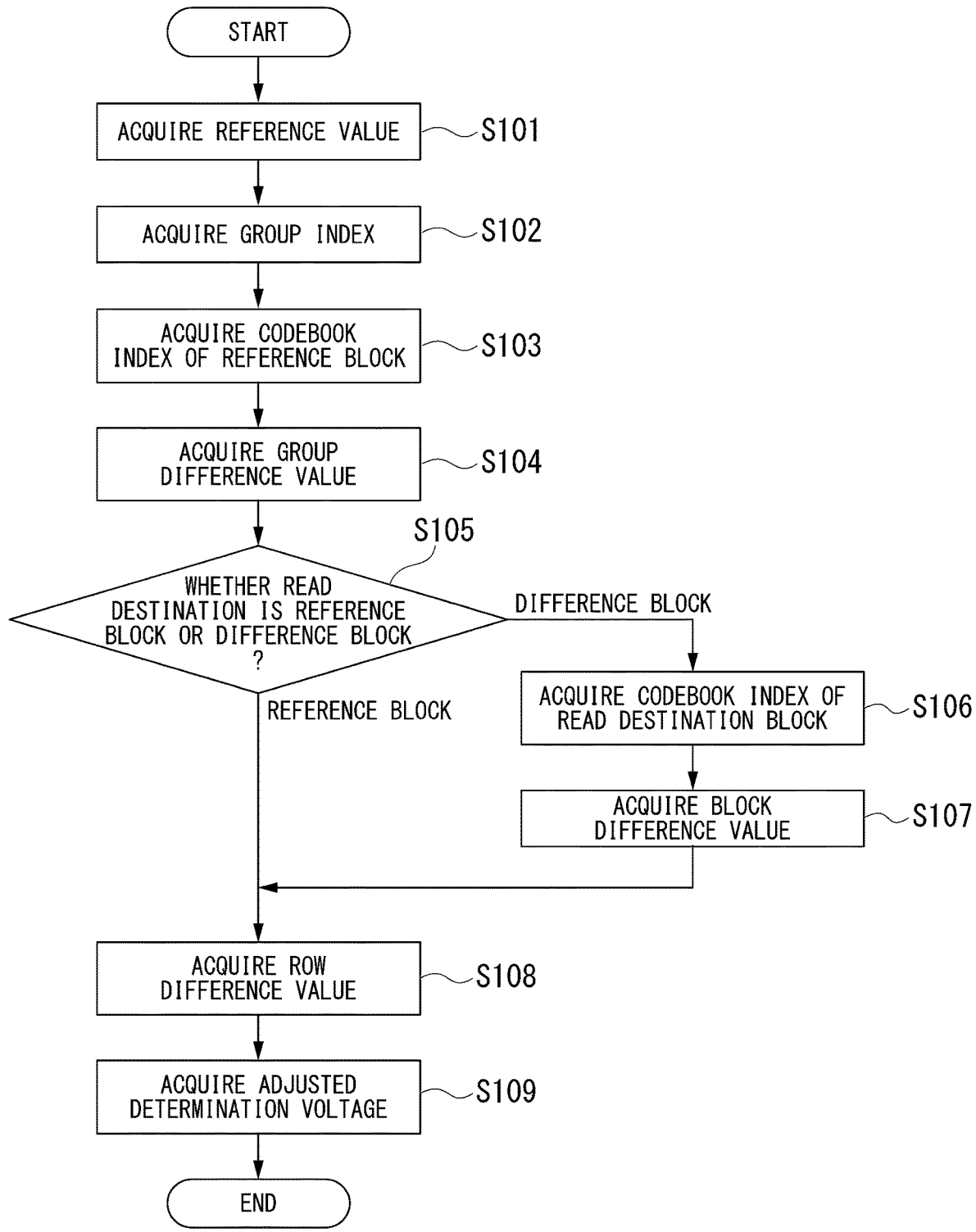
FIG. 12 is a flowchart relating to acquisition of the determination voltage in the first embodiment.

Next, a control flow in the embodiment will be described. First, a process for acquiring the determination voltage V will be described. FIG. 12 is a flowchart relating to acquisition of the determination voltage V. In a case where the determination voltage V for a certain block BLK is acquired, first, the memory controller 10 acquires the reference values VAD to VGD of the determination voltages V with reference to the reference voltage information 110 (S101).

Next, the memory controller 10 acquires a group index of the group G including the block BLK from which data is read (hereinafter, also referred to as "read destination block BLK") with reference to the block management information 123 (S102). Next, the memory controller 10 acquires the codebook index of the reference block RB corresponding to the acquired group index (that is, the reference block RB included in the same group G) with reference to the block management information 123 (S103).

Next, the memory controller 10 designates the codebook index of the reference block RB with reference to the codebook 121 and acquires difference values (hereinafter, also referred to as "group difference values") of the reference block RB with respect to the reference values VAD to VGD of the determination voltages V (S104).

Next, the memory controller 10 determines whether the read destination block BLK is the reference block RB or the difference block DR based on the block management information 123 (S105). In a case where the read destination block BLK is the reference block RB (S105: the reference block), the memory controller 10 proceeds to S108.

On the other hand, in a case where the read destination block BLK is the difference block DB (S105: the difference block), the memory controller 10 acquires the codebook index of the read destination block BLK with reference to the block management information 123 (S106). Next, the memory controller 10 designates the codebook index of the read destination block BLK with reference to the codebook 121, acquires difference values (hereinafter, also referred to as "block difference values") of the difference block DB with respect to the reference block RB (S107) and then proceeds to S108.

Next, the memory controller 10 acquires difference values (hereinafter, also referred to as "row difference values") corresponding to the row index of the selected word line WL with reference to the row difference value information 122 (S108). Next, the memory controller 10 adds the acquired group difference values and row difference values to the reference values VAD to VGD of the determination voltages V acquired in S101 and further adds block difference values in a case where the block difference values are acquired. Thus, the corrected determination voltages V are acquired (S109).

<6.2 Processing Relating to Storing of Determination Voltage V>

Next, a process relating to storing of the determination voltage V will be described. As described above, the appropriate value of the determination voltage V changes due to the influence of stress such as program disturb, read disturb, or data retention. Therefore, it is necessary to update (change) and store the difference values of each of the blocks BLK with respect to the reference values VAD to VGD of the determination voltage V at a predetermined timing (for example, at a predetermined cycle or when an index such as the number of error bits satisfies a predetermined condition).

Hereinafter, as an example of the predetermined timing, an example in which the difference values of the determination voltages V are updated in a case where the number of error bits in a read operation exceeds a correction capability of the ECC circuit 15 will be described. For simplicity of description, it is assumed that a variation in stress applied to the plurality of word lines WL in each of the blocks BLK is small, and it is not necessary to update the row difference value information 122. This premise is the same in other embodiments.

Figure 13:
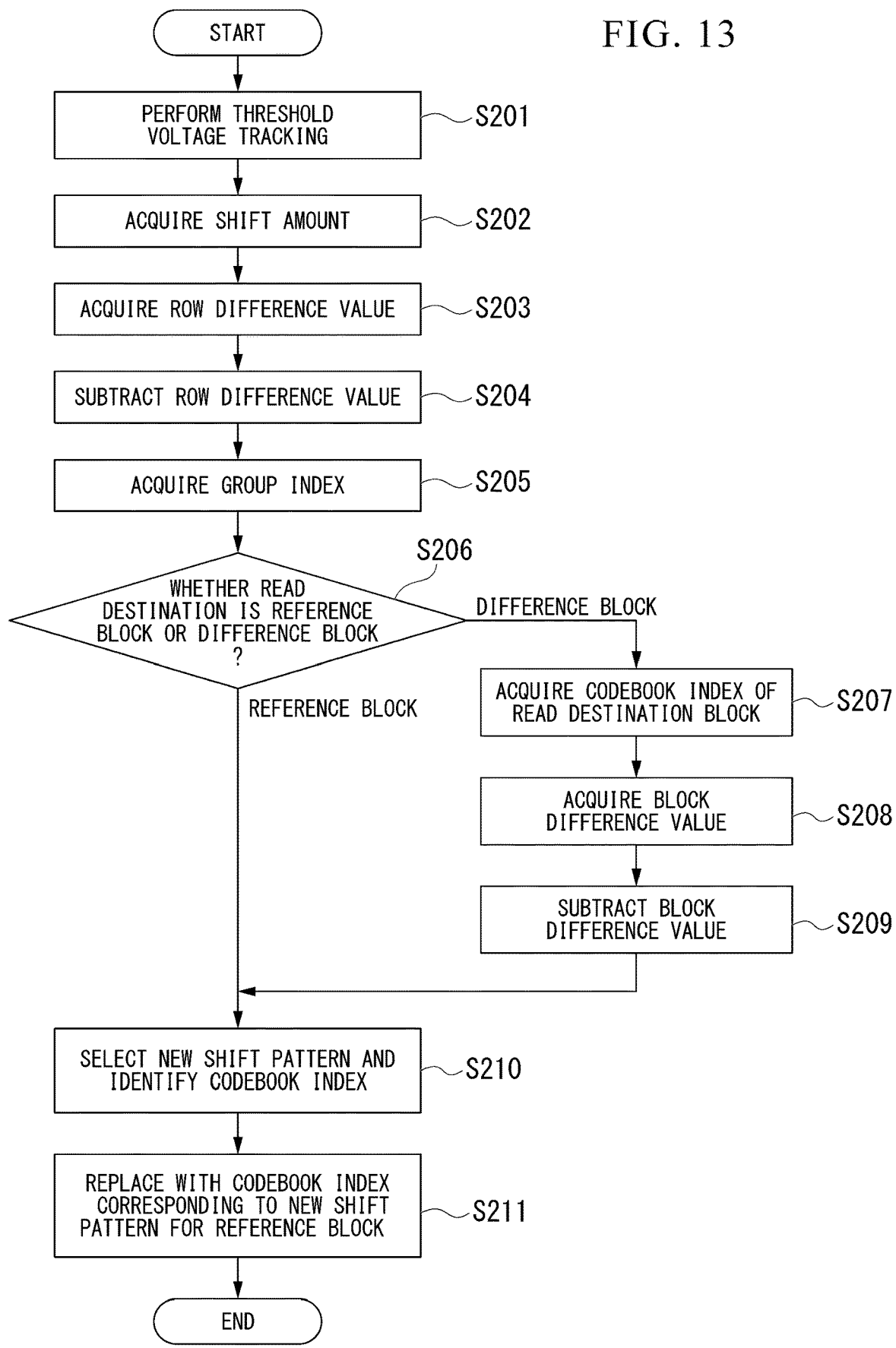
FIG. 13 is a flowchart relating to storage of the determination voltage in the first embodiment.

FIG. 13 is a flowchart relating to the storage of the determination voltage V. The memory controller 10 performs threshold voltage tracking for detecting appropriate values of the determination voltages V for one word line WL of a certain block BLK, for example, at a predetermined timing (S201). In this specification, the "appropriate value" is not limited to an optimum value and may be any value in which a reading error does not occur.

The threshold voltage tracking is a process of searching for valley positions in the threshold distribution of the memory cells MT. Specifically, in the threshold voltage tracking, shift read in which reading is repeatedly performed while the read voltage is shifted by a predetermined step width is performed, and a threshold distribution of the memory cells MT as shown in FIG. 4 is acquired. The memory controller 10 acquires the appropriate values of the determination voltages V (the shift amount from the reference values VAD to VGD) based on the acquired valley positions in the threshold distribution of the memory cells MT (S202).

Next, the memory controller 10 acquires the row difference values corresponding to the row index of the word line WL, on which the threshold voltage tracking has been performed, with reference to the row difference value information 122 (S203). Next, the memory controller 10 subtracts the row difference values from the shift amount acquired in S202 (S204). Thus, the shift amount of the block BLK on which the threshold voltage tracking has been performed is acquired.

Next, the memory controller 10 acquires the group index of the group G including the read destination block BLK, on which the threshold voltage tracking has been performed, with reference to the block management information 123 (S205). Next, the memory controller 10 determines whether the read destination block BLK is the reference block RB or the difference block DB based on the block management information 123 (S206). In a case where the read destination block BLK is the reference block RB (S206: the reference block), the memory controller 10 proceeds to S210.

On the other hand, in a case where the read destination block BLK is the difference block DB (S206: the difference block), the memory controller 10 acquires the codebook index of the read destination block BLK with reference to the block management information 123 (S207). Next, the memory controller 10 designates the codebook index of the read destination block BLK with reference to the codebook 121 and acquires the block difference values of the difference block DB with respect to the reference block RB (S208). Then, the memory controller 10 subtracts the block difference values from the shift amount of the block BLK acquired in S204 (S209).

Next, the memory controller 10 newly selects a shift pattern similar to the shift amount acquired in S204 or S209 from the 256 shift patterns registered in the codebook 121 and identifies a codebook index corresponding to the selected shift pattern (S210).

Next, in the block management information 123, the memory controller 10 replaces the codebook index of the reference block RR included in the same group G as the read destination block BLK with the codebook index newly identified in S210 (S211). That is, in the embodiment, the numerical values of the shift amount registered in the codebook 121 are not updated, but the group difference values are updated by changing the codebook index associated with the reference block RB in the block management information 123. Then, processing of acquiring the determination voltages V of the block BLK included in the same group G is performed using the updated group difference value.

<7. Operation>

Figure 14:
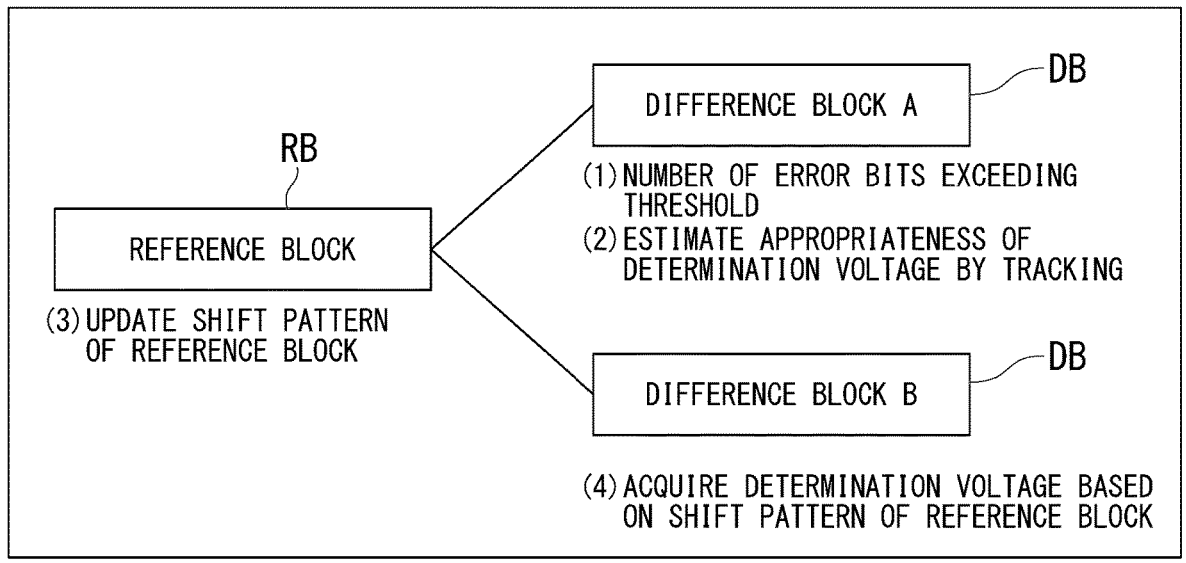
FIG. 14 is a diagram for explaining an operation of the memory system in the first embodiment.

FIG. 14 is a diagram for explaining an operation of the memory system 1. For example, in a case where the number of error bits exceeds a threshold in the read operation in a certain difference block DB (a difference block A) (1), the threshold voltage tracking is performed, and the appropriate values of the determination voltages V are newly detected (2).

Here, in the embodiment, the codebook index of the reference block RB of the same group G is updated to reflect the newly detected appropriate values of the determination voltages V on the determination voltages V of the plurality of blocks BLK included in the same group G (3). As a result, in a case where the read operation is subsequently performed in another difference block DB, the determination voltages V used in the read operation for the difference block DB are acquired based on the updated difference values of the reference block RB with respect to the reference values VAD to VGD and the difference values of the difference block DB with respect to the reference block RB (4). Therefore, the appropriate values newly detected for the difference block A are reflected on the determination voltages V of the difference blocks DB included in the same group G without performing any special updating process on the difference block DR.

<8. Advantages>

In the memory system 1, multi-valuing of data values written in the memory cells MT are performed. Multi-valuing of the memory cells MT increases a probability of occurrence of error bits. In a case where a read error occurs, the memory controller 10 performs error correction. For example, in a case where the number of error bits exceeds the correction capability of the ECC circuit 15, the memory controller 10 performs the threshold voltage tracking and detects the appropriate values of the determination voltages V. Here, in the case in which the appropriate values of the determination voltages V are managed for each of the blocks BLK, even in a case where the appropriate values of the determination voltages V for one block BLK are updated, the updated appropriate values are not referred to in the read operation in another block BLK. Thus, a large number of data erroneous determinations may occur, and as a result, the process of acquiring the appropriate values of the determination voltages V may be repeated by the number of blocks BLK.

Therefore, in a case where one or more common difference values (one or more group difference values) with respect to the reference values VAD to VGD of the determination voltages V are managed in the group G including the plurality of blocks BLK, and the appropriate values of the determination voltages V are acquired by the threshold voltage tracking, the memory controller 10 in the embodiment updates the common difference values of the group G based on the appropriate values of the determination voltages V. In other words, in a case where the appropriate values of the determination voltages V for one block BLK is updated, the updated appropriate values are also reflected on the determination voltages V in another block BLK. Thus, the occurrence of erroneous determination of data can be reduced, and the repeated process for acquiring the appropriate values of the determination voltages V can be curbed. Accordingly, characteristics of the memory system 1 relating to data reading can be improved.

In the embodiment, for example, the data value "110" corresponding to the distribution A is an example of a "first data value". A value of VBD which is the reference value of the determination voltage VB is an example of a "first value". A adjustment amount (i.e., a difference value) corresponding to the determination voltage VB included in the group difference values of the group G0 is an example of each of a "first difference value" and a "first common difference value". The adjustment amount (i.e., a difference value) corresponding to the determination voltage VB included in the block difference values of the block BLK1 of the group G0 is an example of each of a "second difference value" and a "second common difference value". The adjustment amount (i.e., a difference value) corresponding to the determination voltage VB included in the block difference value of the block BLK2 of the group G0 is an example of each of a "third difference value" and a "third common difference value". The third difference value is often different from the second difference value but may be the same as the second difference value. For example, in a case where different determination voltages are applied to the above-described second word line and fifth word line, the third difference value is different from the second difference value. The adjustment amount (i.e., a difference value) corresponding to the determination voltage VB included in the group difference value of the group G1 is an example of each of a "fourth difference value" and a "fourth common difference value". The predetermined timing (for example, in a case where the number of error bits exceeds a predetermined value) is an example of "in a case where the first condition is satisfied". The correction amount (i.e., a difference value) corresponding to the first word line WL0 included in the row difference value information 122 is an example of each of a "fifth difference value" and a "first individual difference value". The adjustment amount (i.e., a difference value) corresponding to the second word line WL1 included in the row difference value information 122 is an example of each of a "sixth difference value" and a "second individual difference value".

EXAMPLES

Next, three examples of a constitution of the group G will be described as examples of the first embodiment. Here, in order to reduce the number of updates of the determination voltages V of the block BLK in the group G, a plurality of BLKs read out at the same time may be included in one group G so that the influence of stress does not vary.

First Constitution Example

The Group is Constituted by a Plurality of Blocks in which Metadata is Stored

Figure 15:
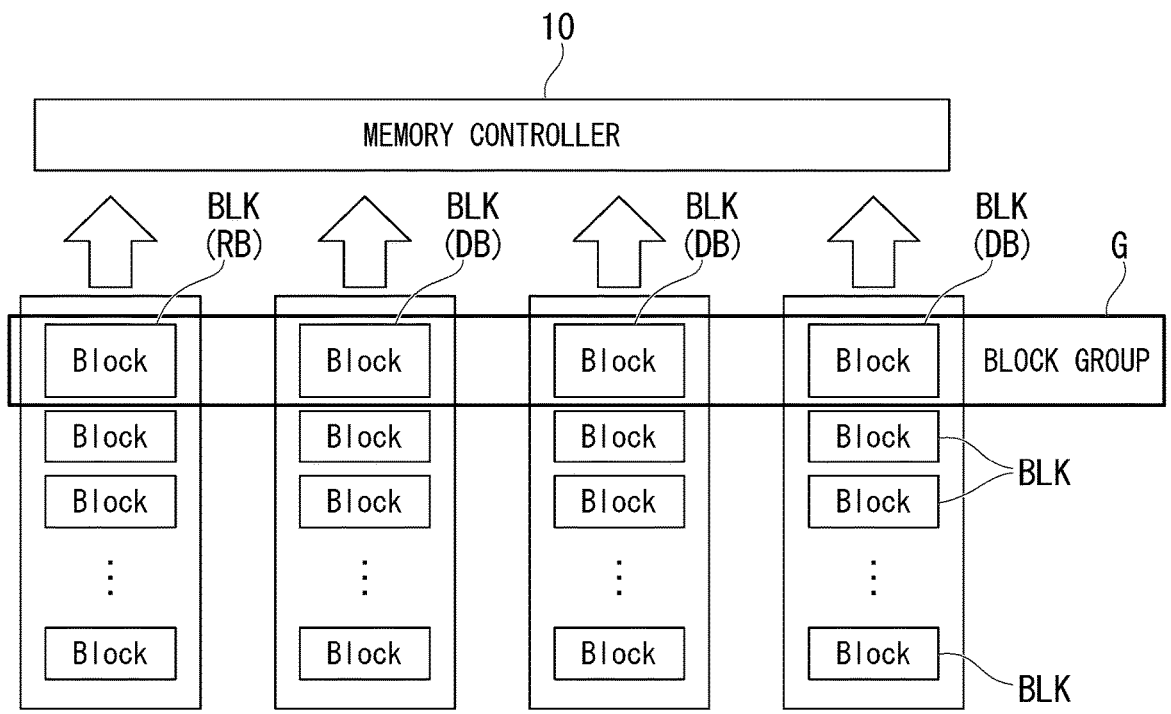
FIG. 15 is a diagram showing a first constitution example of a group in an example of the first embodiment.

FIG. 15 is a diagram showing a first constitution example of the group G. In the NAND memory 20, metadata required for data management may be stored in the plurality of blocks BLK by a management unit called a block group. In a case where the plurality of blocks BLK from which metadata is read out (the plurality of blocks BLK included in one block group) are set in the same group G, a process of reading the blocks BLK in the group G at the same time becomes possible. Thus, the number of times that the blocks BLK in the group G are read out at the same time can be increased, and the number of updates of the determination voltage V of the blocks BLK in the group G can be reduced.

Second Constitution Example

Figure 16:
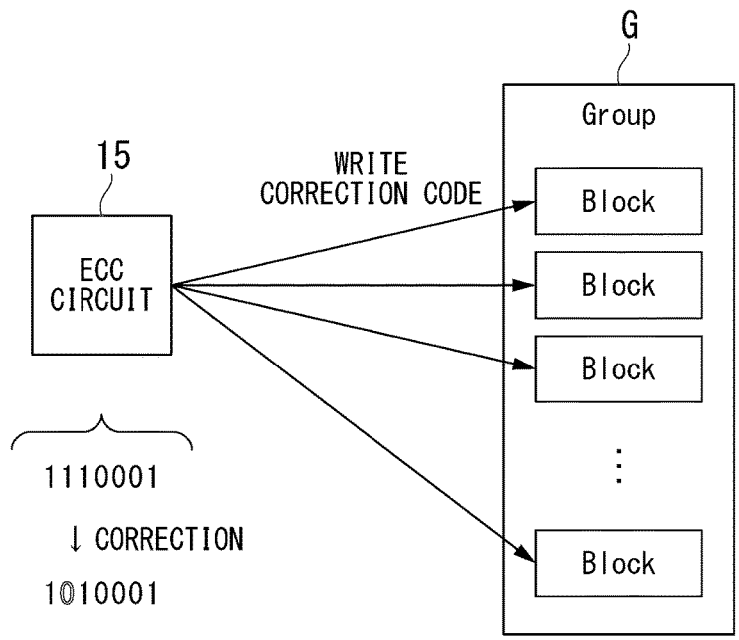
FIG. 16 is a diagram showing a second constitution example of a group in an example of the first embodiment.

The Group is Constituted by a Plurality of Blocks in which Correction Codes are Stored FIG. 16 is a diagram showing a second constitution example of the group G. In a case where the ECC circuit 15 having a high error correction capability is used, the ECC circuit 15 writes correction codes separately in a plurality of blocks BLK in the group G. In this case, the reading of the correction codes is performed by, for example, sequential reading for continuously reading data from the plurality of blocks BLK for efficiency. In a case where the plurality of blocks BLK from which such sequential reading is performed are set in the same group G, a process of reading the blocks BLK in the group G at the same time becomes possible. Thus, the number of times that the blocks BLK in the group G are read out at the same time can be increased, and the number of updates of the determination voltages V of the blocks BLK in the group G can be reduced.

In another example, the ECC circuit 15 also writes, as the block BLK in the group G, a correction code for each of the blocks BLK based on data written to the plurality of blocks BLK in the group G. For example, in a case where a certain group G includes ten blocks BLK, the ECC circuit 15 calculates data written in nine blocks BLK and generates a correction code having a size of one block BLK. In this case, the ECC circuit 15 writes the correction code to one block BLK included in the same group G as the nine blocks BLK to which data is written. In this case, the reading of the write data and the correction code is performed by sequential read for continuously reading data from the plurality of blocks BLK, for example, for efficiency. In a case where the plurality of blocks BLK from which such sequential reading is performed are set in the same group G, a process for reading the blocks BLK in the group G at the same time becomes possible. Thus, the number of times that the blocks BLK in the group G are read out at the same time can be increased, and the number of updates of the determination voltages V of the blocks BLK in the group G can be reduced.

Third Constitution Example

The Group is Constituted by a Plurality of Blocks in which Hot Data is Stored

Figure 17:
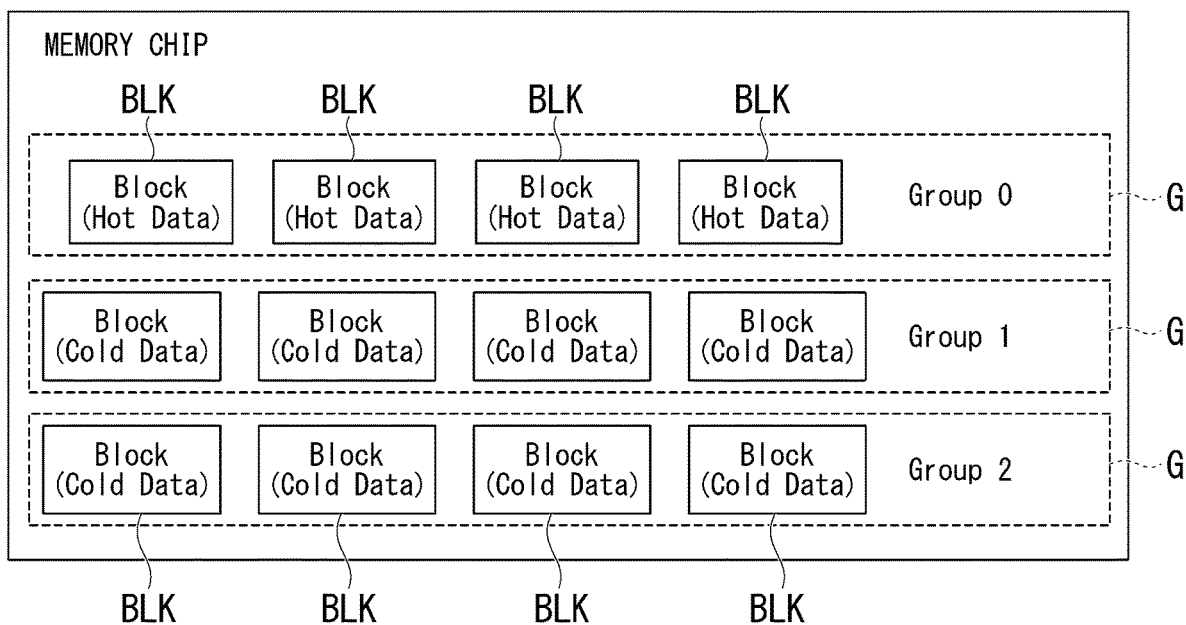
FIG. 17 is a diagram showing a third constitution example of a group in an example of the first embodiment.

FIG. 17 is a diagram showing a third constitution example of the group G. Here, the hot data is data having a relatively high access frequency (e.g., data having an access frequency equal to or higher than a predetermined threshold). On the other hand, cold data is data having a relatively low access frequency (e.g., data having an access frequency less than a predetermined threshold). In the constitution example, the plurality of blocks BLK in which the hot data is stored are set in the same group G. Further, the plurality of blocks BLK in which the cold data is stored are set in the same group G. Thus, a read timing for the plurality of blocks BLK may be adjusted at the same time. Accordingly, the number of times that the blocks BLK in the group G are read out at the same time can be increased, and the number of updates of the determination voltages V of the blocks BLK in the group G can be reduced. Next, a modification of the first embodiment will be described.

First Modification

FIG. 18 is a diagram showing an example of the common difference value information 121 in a first modification of the first embodiment. In this modification, the common difference value information 121 includes a first codebook 121A and a second codebook 121B. Each of the first codebook 121A and the second codebook 121B has the same data structure as the above-described codebook 121.

The first codebook 121A is a codebook in which a shift pattern that is the difference values (the group difference values) of the reference block RB with respect to the reference values VAD to VGD of the determination voltages V is registered. The shift pattern registered in the first codebook 121A has, for example, 256 patterns. Thus, the codebook index of the first codebook 121A can be indicated by 8 bits.

On the other hand, the second codebook 121B is a codebook in which shift patterns that are the difference values (the block difference values) of the difference blocks DB with respect to the determination voltages V of the reference block RB is registered. Here, the difference values (the block difference values) of the difference block DB does not vary as much as the difference values (the group difference values) of the reference block RB. Therefore, the number of shift patterns registered in the second codebook 121B may be, for example, within 64. Thus, the codebook index of the second codebook 121B may be indicated by 6 bits. That is, according to this modification, the number of bits of the codebook index that designates the difference values of the difference block DB can be reduced, and thus, for example, a data amount of an internal command of the memory controller 10 used for calculating the values of the determination voltages V can be reduced.

The first codebook 121A is an example of each of "first information" and "first difference value information". The codebook index of the first codebook 121A is an example of "first type identification number". The second codebook 121B is an example of each of "second information" and "second difference value information". The codebook index of the second codebook 121B is an example of a "second type identification number".

Second Modification

In the above-described first embodiment, the group difference values are indicated by a codebook index. However, in the codebook 121, numerical values of the group difference values (the shift pattern) of each of the groups G may be directly registered in association with the group index of each of the groups G. In this case, in order to update the determination voltages V, the codebook index associated with the reference block RB is not changed in the block management information 123, and the numerical values of the difference values registered in the codebook 121 may be changed.

Second Embodiment

A second embodiment is different from the first embodiment in that, when where the determination voltages V are updated, it is determined whether the difference values (the group difference values) of the reference block RB with respect to the reference values VAD to VGD is updated or the difference value (the block difference value) of the difference block DB with respect to the reference block RB is updated. Constitutions other than those described below are the same as those of the first embodiment.

In the memory system 1, when the stress has applied to each of the blocks BLK increases, appropriate difference values of the determination voltages V between the plurality of blocks BLK may change. Thus, if only the update of the difference value (the group difference value) of the reference block RB is repeated, a deviation of the determination voltage V of the difference block DB with respect to the appropriate value may increase.

FIG. 19 is a diagram showing an example of tag information 124 used for determining an update target. The tag information 124 is stored in, for example, the memory chip 21 and is used by being loaded into the RAM 12 as a part of the determination voltage information 100. In the tag information 124, for example, a threshold relating to the number of program/erase cycles (hereinafter, also referred to as "the number of P/E cycles") and a threshold relating to the number of error bits are registered in association with the group index. The number of P/E cycles is an example of "the number of times of writing".

In the embodiment, the memory controller 10 determines whether the difference values (the group difference values) of the reference block RB is updated or the difference values (the block difference values) of the difference block DR is updated by referring to the tag information 124. For example, in the example shown in FIG. 19, [1000, 2000, 3000] are set as the thresholds of the number of P/E cycles for a tag having a group index 0. Therefore, the memory controller 10 updates the difference values (the group difference values) of the reference block RB of the first group G0 at the timing in a case where the number of P/E cycles of the reference block RB of the first group G0 reaches 1000, 2000, and 3000, respectively.

In the example shown in FIG. 19, [1500, 2500, 3500] is set as the thresholds of the number of error bits for the tag having the group index 0. Thus, the memory controller 10 updates the difference values (the group difference values) of the reference block RB of the first group G0 at the timing that the number of error bits in a case where data is read out from the reference block RB of the first group G0 reaches 1500, 2500, and 3500, respectively. The memory controller 10 performs the above-described update in a case where any of conditions of the number of P/E cycles and the number of error bits is satisfied.

The number of error bits increases with aging of the memory chip 21. Thus, a plurality of thresholds are prepared as thresholds for the number of error bits. For example, in a case where the number of error bits after the threshold voltage tracking is performed in the reference block RB of the first group G0 is 1600, since it is predicted that the value will not fall below the threshold 1500 in the future, 2500 will be used as the threshold from the next time.

Figure 20:
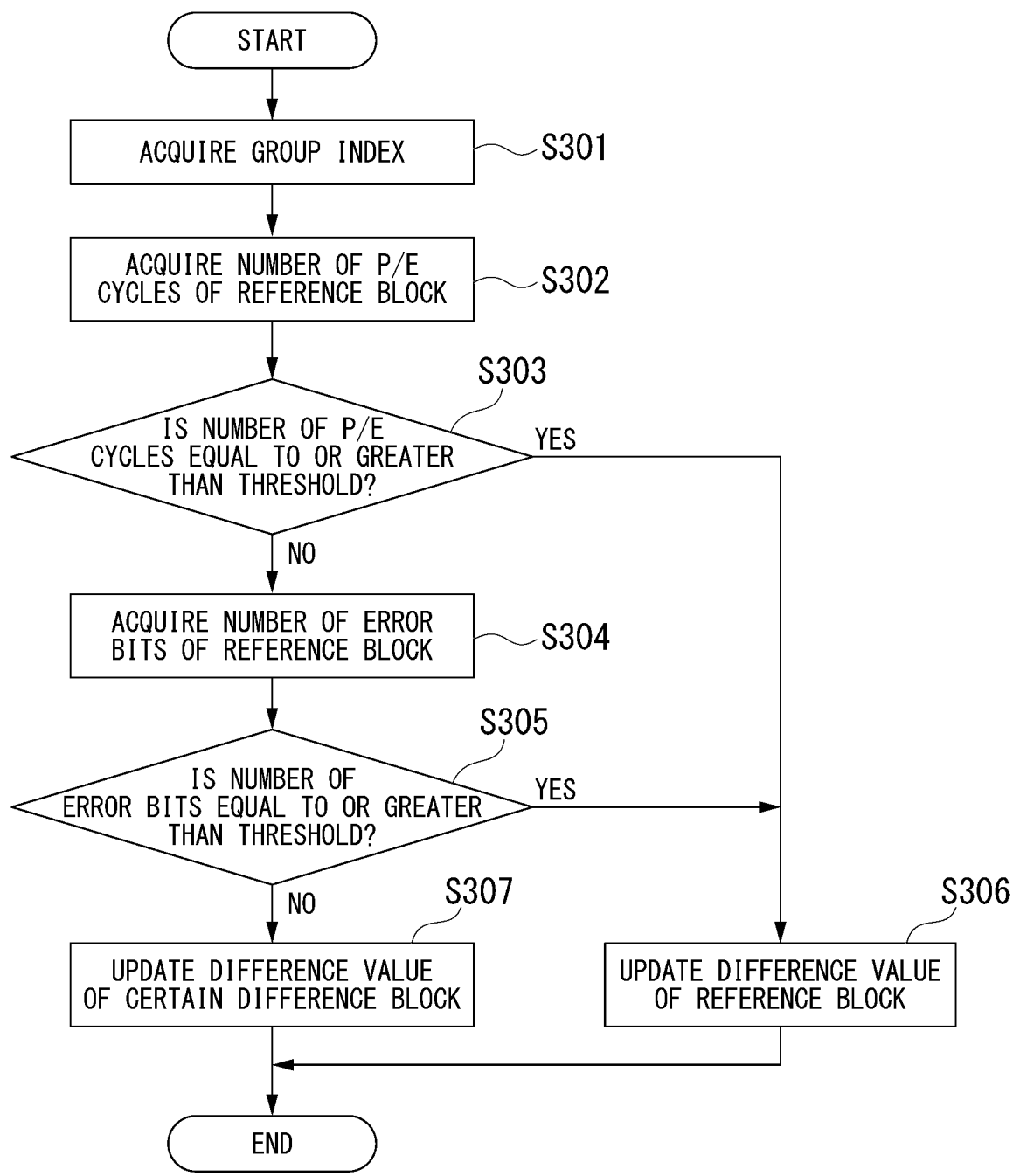
FIG. 20 is a flowchart of a process for determining whether to update a difference value of a reference block or to update a difference value of a difference block in a second embodiment.

FIG. 20 is a flowchart of a process of determining whether the difference values of the reference block RB are updated or the difference values of the difference block DB are updated. In the embodiment, in a case where the number of error bits or the error bit rate exceeds a threshold in a read operation for a certain difference block DB (for example, in a case where the correction capability of the ECC circuit 15 is exceeded), the memory controller 10 starts the process shown in FIG. 20.

First, the memory controller 10 acquires a group index corresponding to the difference block DB in which the number of error bits exceeds a threshold (hereinafter, also referred to as a "specific difference block DB") with reference to the block management information 123 (S301).

Next, the memory controller 10 identifies a reference block RB included in the same group G as the specific difference block DB based on the acquired group index and the block management information 123 and acquires the number of P/E cycles of the identified reference block RB (S302). The number of P/E cycles of the reference block RB is, for example, stored in a nonvolatile manner in the memory chip 21 and is loaded into the RAM 12 during an operation.

Then, the memory controller 10 compares the number of P/E cycles of the reference block RB with a threshold of the number of P/E cycles included in the tag information 124 and determines whether or not the number of P/E cycles of the reference block RB is equal to or greater than the threshold included in the tag information 124 (S303). In a case where the number of P/E cycles of the reference block RB is equal to or greater than the threshold included in the tag information 124 (S303: YES), the memory controller 10 proceeds to S306. On the other hand, in a case where the number of P/E cycles of the reference block RB is less than the threshold included in the tag information 124 (S303: NO), the memory controller 10 proceeds to S304.

In a determination process regarding the number of error bits, the memory controller 10 performs a read operation on the reference block RB and acquires the number of error bits (S304). Then, the memory controller 10 compares the number of error bits of the reference block RB with a threshold of the number of error bits included in the tag information 124 and determines whether or not the number of error bits of the reference block RB is equal to or greater than the threshold of the number of error bits (S305). In a case where the number of error bits of the reference block RB is equal to or greater than the threshold included in the tag information 124 (S305: YES), the memory controller 10 proceeds to S306. On the other hand, in a case where the number of error bits of the reference block RB is smaller than the threshold included in the tag information 124 (S305: NO), the memory controller 10 proceeds to S307.

In a case where the number of P/E cycles of the reference block RB is equal to or greater than the threshold included in the tag information 124 (S303: YES), or in a case where the number of error bits of the reference block RB is equal to or greater than the threshold included in the tag information 124 (S305: YES), the memory controller 10 updates the difference values (the group difference values) of the reference block RB (S306). The process of updating the difference values of the reference block RB is the same as the process of the first embodiment described with reference to FIG. 13.

On the other hand, in a case where the number of P/E cycles of the reference block RB is less than the threshold included in the tag information 124 (S303: NO), and in a case where the number of error bits of the reference block RB is less than the threshold included in the tag information 124 (S305: NO), the memory controller 10 updates the difference values (the block difference values) of the specific difference block DB (S307).

Figure 21:
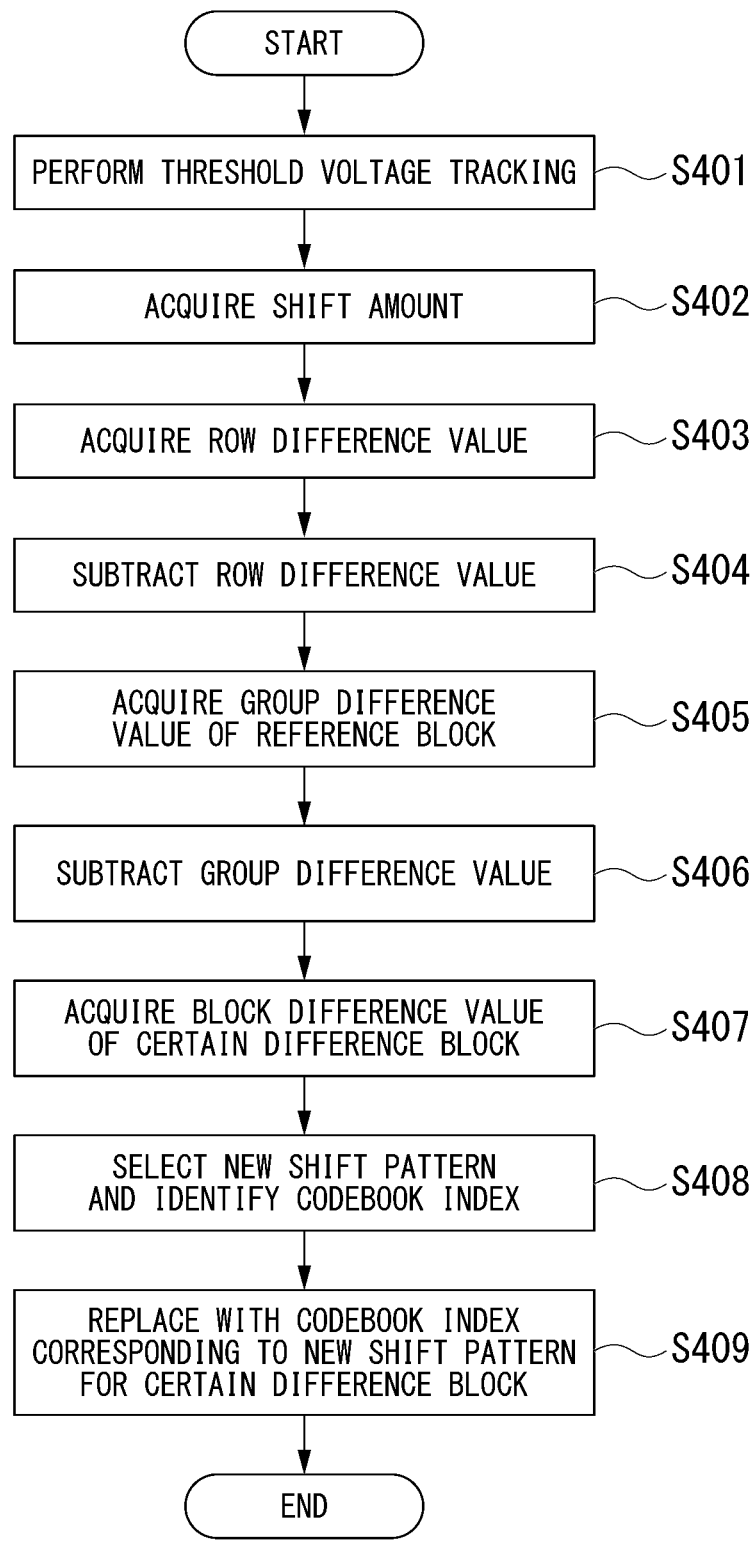
FIG. 21 is a flowchart of a process for updating a block difference value of a specific difference block in the second embodiment.

FIG. 21 is a flowchart of a process of updating the block difference value of the specific difference block DB. The memory controller 10 performs the threshold voltage tracking for detecting appropriate values of the determination voltages V for one word line WL of the specific difference block DB (S401). The memory controller 10 acquires the appropriate value of the determination voltages V (the shift amount from the reference values VAD to VGD) based on the acquired threshold distribution of the memory cell MT (S402).

Next, the memory controller 10 acquires the row difference values corresponding to the row index of the word line WL, on which the threshold voltage tracking has been performed, with reference to the row difference value information 122 (S403). Next, the memory controller 10 subtracts the row difference values from the shift amount acquired in S402 (S404). Thus, the shift amount of the block BLK on which the threshold voltage tracking has been performed is acquired.

Next, the memory controller 10 acquires the difference values (the group difference values) of the reference block RB of the same group G as the specific difference block DB with reference to the codebook 121 (S405). Then, the memory controller 10 subtracts the group difference value from the shift amount acquired in S404 (S406). Thus, the memory controller 10 acquires appropriate difference values (the block difference values) of the specific difference block DB with respect to the reference block RB (S407).

Next, the memory controller 10 newly selects a shift pattern which approximates the block difference values acquired in S407 from the 256 shift patterns registered in the codebook 121 and identifies a codebook index corresponding to the shift pattern (S408). Then, the memory controller 10 replaces the codebook index of the specific difference block DB with the newly identified codebook index in the block management information 123 (S409). Thus, the difference value of the specific difference block DB is changed without changing the difference value of the reference block RB.

For example, according to the above-described constitution, it is possible to appropriately determine whether the difference values of the reference block RB are updated or the difference values of the specific difference block DB are updated. That is, in a case where the appropriate values of the determination voltages V for the entire group G changes, the determination voltages V of the entire group G can be updated collectively by updating the difference values (the group difference values) of the reference block RB. On the other hand, in a case where the number of P/E cycles and/or the number of error bits of the reference block RB is less than the threshold, it is assumed that the determination voltages V of the specific difference block DB have greatly changed, and only the determination voltages V of the specific difference block DB may be updated.

In the embodiment, the case in which the number of error bits or the error bit rate exceeds the threshold in the read operation for the difference block DB is an example of "in a case where a predetermined condition is satisfied". Each of comparison of the number of P/E cycles of the reference block RB with the threshold of the number of P/E cycles included in the tag information 124, and comparison of the number of error bits of the reference block RB with the threshold of the number of error bits included in the tag information 124 is an example of a "first determination". The case in which the number of P/E cycles of the reference block RB is equal to or greater than the threshold included in the tag information 124, or the case in which the number of error bits of the reference block RB is equal to or greater than the threshold included in the tag information 124 is an example of "in a case where the first condition is satisfied". On the other hand, the case in which the number of P/E cycles of the reference block RB is less than the threshold included in the tag information 124 and also the number of error bits of the reference block RB is less than the threshold included in the tag information 124 is an example of "in a case where the second condition is satisfied".

The determination regarding the number of P/E cycles of the reference block RB and/or the determination regarding the number of error bits may be so that the above-described process is performed only on some of the memory cells MT included in the reference block RB. Further, the threshold for determining whether or not the reference block RB needs to be updated may be only one of the number of P/E cycles and the number of error bits. The threshold may be an error bit rate, the number of read operations, or a temperature change, instead of the number of P/E cycles and the number of error bits.

Third Embodiment

A third embodiment is different from the first embodiment in that setting of the reference block RB and the difference block DB or setting of a read command is performed so that the read operation on the reference block RB is performed before the read operation on the difference block DB. Constitutions other than those described below are the same as those of the first embodiment.

In the above-described second embodiment, in a case where the number of error bits or the error bit rate exceeds the threshold in reading the difference block DB, the read operation of the reference blocks RB included in the same group G is performed, and it is determined whether the difference values of the reference block RB are updated or the difference values of the difference block DB are updated based on the comparison between the number of error bits of the reference block RB and the threshold. In this case, the read operation of the reference block RB is performed in a case wherever the difference values of the difference block DB are updated, and an increase in latency may be caused.

Therefore, in a case where it is determined whether or not the difference values of the difference block DB need to be updated, the number of error bits of the reference block RB may be acquired first. In other words, in the read operation in a certain group G, data may be read in the order of the reference block RB and the difference block DB.

Here, among computer programs, there is a program which repeatedly reads and writes the same data. This is because the host device 2 repeats an access request to the same logical/physical addresses. At this time, the memory controller 10 repeats reading data from the plurality of blocks BLK in a series of orders. In such a case, the memory controller 10 sets, as the reference block RB, the block BLK accessed first among the plurality of blocks BLK accessed in a series order. Such setting can be performed using, for example, the block management information 123. Alternatively, in a case where there are the plurality of blocks BLK to be accessed in a series of order, the data read order (that is, the order of the read destination addresses included in the read command) may be changed by the memory controller 10 so that the access starts from the reference block RB among the plurality of blocks BLK. For example, in a case where data is read from the plurality of blocks BLK in a series of processes by the above-described process, the memory controller 10 reads data from the reference block RB first and then reads data sequentially from the remaining difference blocks DB.

According to such a configuration, in a case where the number of error bits or the error bit rate exceeds the threshold in reading a difference block DB and it is determined whether the difference values of the reference block RB are updated or the difference values of the difference block DB are updated, since the number of error bits or the error bit rate of the reference block RB has been acquired in advance, it is not necessary to perform the process of acquiring the number of error bits or the error bit rate of the reference block RB. Thus, an operation speed of the memory system 1 can be improved (for example, latency can be reduced).

Examples

Next, as examples of the third embodiment, two processing examples in which the reference block RB is read first will be described.

First Processing Example

Queuing of Continuous Read Operation

Figure 22:
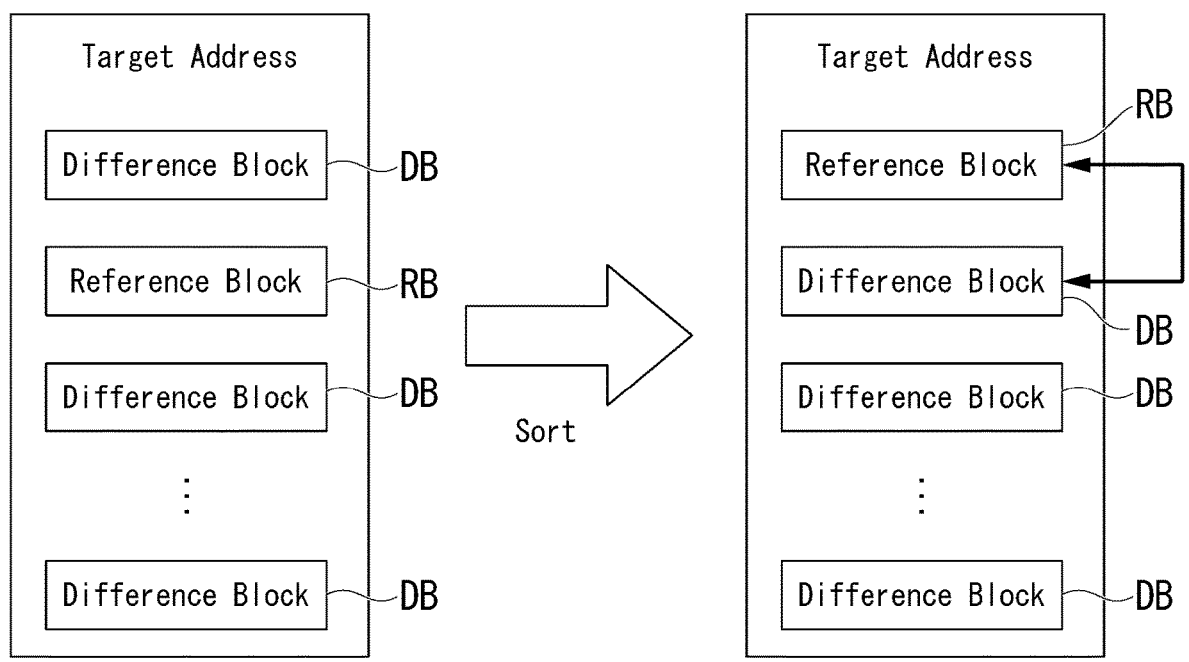
FIG. 22 is a diagram conceptually showing a first processing example in a third embodiment.

FIG. 22 is a diagram conceptually showing a first processing example. The host device 2 may continuously transmit a plurality of commands (for example, a plurality of read commands) to the memory controller 10. Each of the commands includes a leading address and an address length. In a case where a plurality of commands are received from the host device 2, the memory controller 10 determines continuity of addresses of the plurality of received commands. In a case where the addresses of the plurality of received commands are continuous, the memory controller 10 determines that the plurality of commands are one sequential read command. In a case where a plurality of write commands are received, the memory controller 10 determines that the plurality of commands are one sequential write command.

In the first processing example, in a case where the addresses of the plurality of read commands received from the host device 2 are continuous, the memory controller 10 determines that the plurality of read commands are one sequential read command In a case where the address of the reference block RB is present in the addresses of the plurality of read commands, the memory controller 10 queues and rearranges the plurality of read commands so that the addresses of the reference block RB are first. Then, the memory controller 10 transmits the plurality of read commands to the memory chip 21 with the read command including the addresses of the reference block RB as the head.

For example, the block BLK0 may be the reference block RB and the block BLK1 may be the difference block DB. Here, it is assumed that the memory controller 10 receives, from the host device 2, a first command which indicates of reading data from the block BLK1 and a second command which indicates of reading data from the block BLK0 in the order of the first command and the second command. At this time, in a case where the addresses indicated by the first command and the second command are continuous, the memory controller 10 determines that the two commands are the sequential read commands. In response to this determination, the memory controller 10 changes the read order and reads data from the blocks BLK0 (the reference block RB) and BLK1 (the difference block DB) in the order of the block BLK0 and the block BLK1.

Second Processing Example

Cooperation with Garbage Collection

Figure 23:
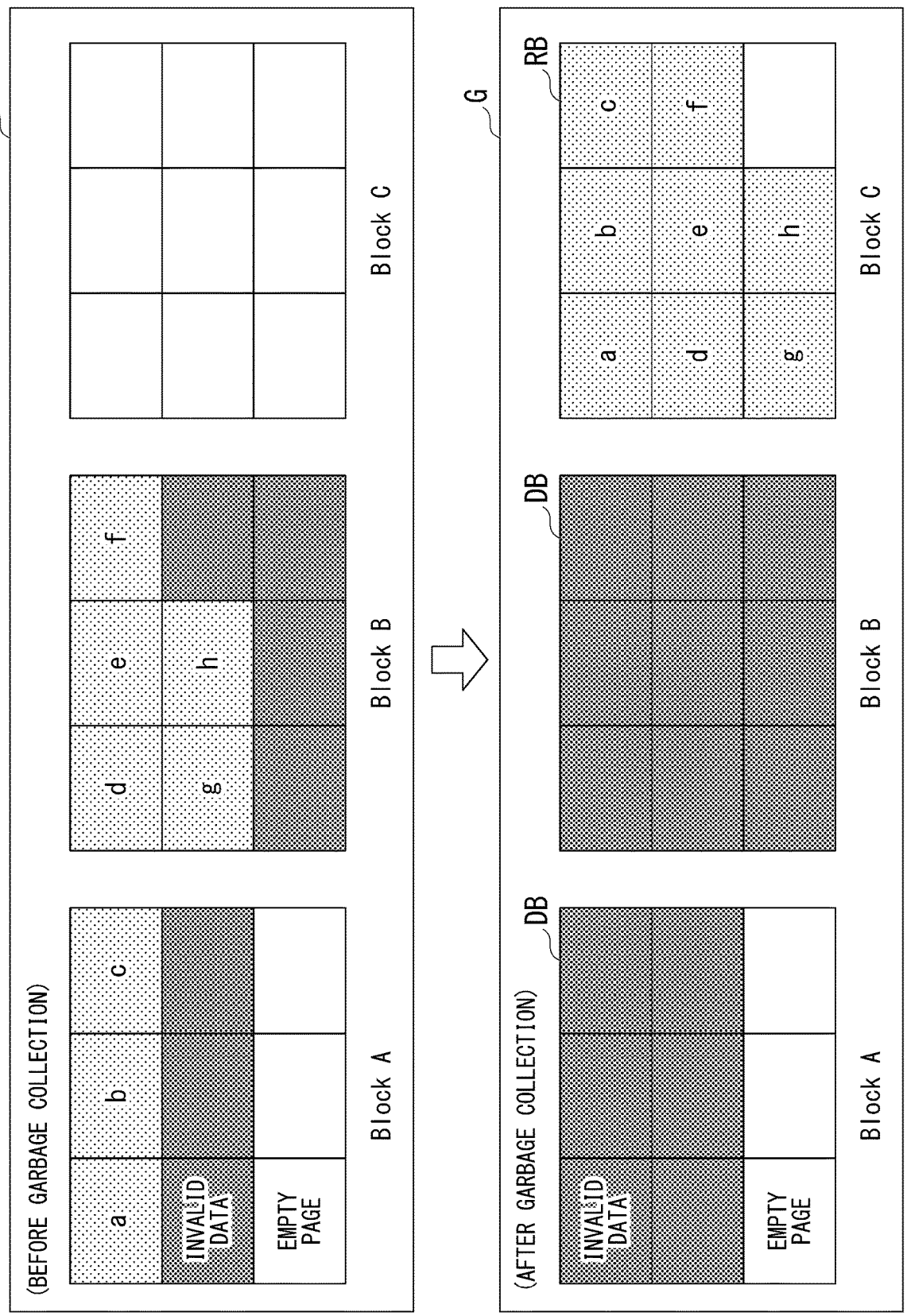
FIG. 23 is a diagram conceptually showing a second processing example in the third embodiment.

FIG. 23 is a diagram conceptually showing a second processing example. Garbage collection is a process of increasing the number of free blocks to curb a decrease in a write speed of the NAND memory 20. Specifically, the garbage collection is a process in which at least the valid data is copied from the plurality of blocks BLK (moving source blocks BLK) in which the valid data and invalid data are stored to one or more blocks BLK (moving destination blocks BLK) of which the number is smaller than the number of the moving source blocks BLK, and data of the plurality of moving source blocks BLK is invalidated.

Here, in a case where a case in which valid data stored in a block A or a block B which is the moving source block BLK becomes a leading address of a data read destination address is relatively high in the newly constituted group G, a block C which is the moving destination block BLK is set as the reference block RB.

In the second processing example, it is assumed that, for example, a block A, a block B, and a block C are included in one group G. In a case where the number of times that the valid data stored in the block A becomes the leading address of the read destination address satisfies a predetermined condition (for example, in a case where the number is relatively large in the group G including the block A), in the garbage collection, the memory controller 10 moves the data stored in the blocks A and B to the block C and newly sets the block C as the reference block RB. The block A may be included in the same group G as the blocks B and C before the garbage collection or may be included together with the blocks B and C in a new group G generated along with the garbage collection.

Fourth Embodiment

A fourth embodiment is different from the first embodiment in that the appropriate values of the determination voltages V of the difference blocks DB are estimated and updated using a linear regression model. Constitutions other than those described below are the same as those of the first embodiment.

Figure 24:
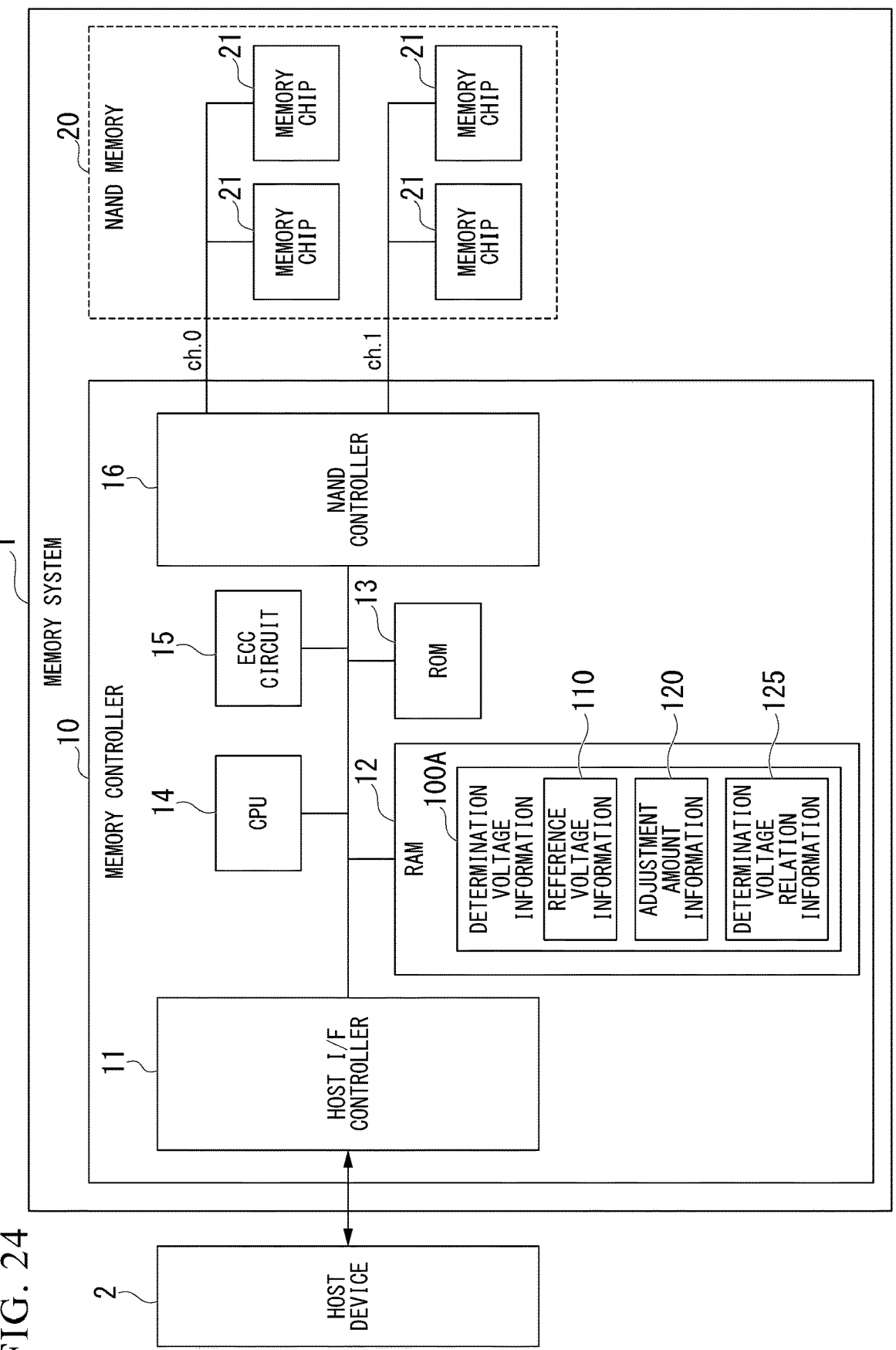
FIG. 24 is a block diagram showing a constitution of a memory system in a fourth embodiment.

FIG. 24 is a block diagram showing a constitution of the memory system 1 according to the fourth embodiment. In the embodiment, determination voltage information 100A includes determination voltage relation information 125. The determination voltage relation information 125 will be described later.

Figure 25:
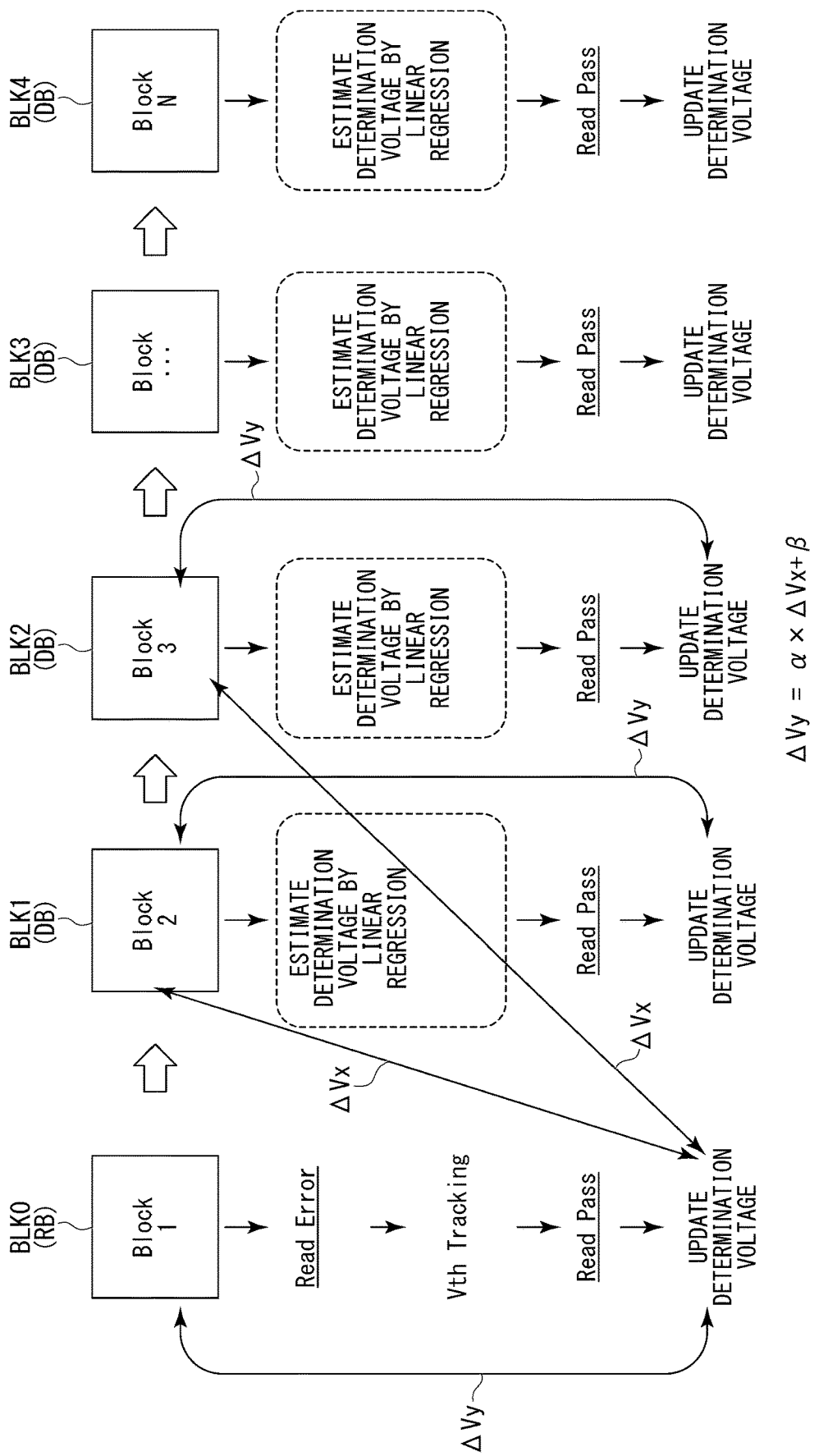
FIG. 25 is a diagram conceptually showing a method for managing a block difference value in the fourth embodiment.

FIG. 25 is a diagram conceptually showing a method for managing block difference values according to the fourth embodiment. In the embodiment, a difference value between the determination voltage V of the reference block RB and the determination voltage V of the difference block DB is defined as Vx, and a change amount Vy of the determination voltage of each of the blocks BLK is expressed by the following Equation (1).

$$Vy = \alpha \times Vx + \beta \qquad \text{Equation (1)}$$

Here, $\alpha$ and $\beta$ are hyper parameters and may be calculated by machine learning (statistics regression model) based on a database in which differences in the determination voltages V between the plurality of blocks BLK are actually recorded. That is, as shown in FIG. 25, in a case where the block BLK0 is the reference block RB, the determination voltages V of the plurality of difference blocks DB of the blocks BLK1 to BLK (N−1) are estimated based on Equation (1) without performing the read operation (the threshold voltage tracking) for each of the difference blocks DR.

More specifically, first, in a case where the number of error bits or the error bit rate is equal to or greater than a threshold in the read operation of a certain block BLK (which may be the reference block RB or the difference block DB) (for example, in a case where the number of error bits exceeds the correction capability of the ECC circuit 15), the memory controller 10 determines a read error. With this determination, the memory controller 10 performs threshold voltage tracking (Vth Tracking) with respect to the reference block RB in the group G including the certain block BLK and detects appropriate values of the determination voltages V.

Then, the memory controller 10 performs the read operation on the block BLK (the reference block RB) using the newly detected determination voltages V and updates the group difference values based on the new determination voltages V. This process is the same as the process described in the first embodiment with reference to FIG. 13 (for example, the processes of S210 and S211).

Next, the memory controller 10 derives appropriate values of the determination voltages V of each of the difference blocks DB in the same group G using the determination voltage relation information 125 (refer to FIG. 24) based on the newly acquired appropriate values of the determination voltages V of the reference block RB. Here, the determination voltage relation information 125 is information in which a relationship between the appropriate value of the determination voltage V of the reference block RB and the appropriate value of the determination voltage V of each of the difference blocks DB is acquired by machine learning. For example, the determination voltage relation information 125 includes the above-described Equation (1) and the hyper parameters $\alpha$ and $\beta$ regarding each of the difference blocks DB.

That is, the memory controller 10 calculates the appropriate values of the determination voltages V of each of the difference blocks DR based on the newly acquired determination voltages V of the reference block RB, Equation (1), and the hyper parameters $\alpha$ and $\beta$. Then, the memory controller 10 performs the read operation on each of the difference blocks DB using the calculated determination voltages V.

In a case where data reading from each of the difference blocks DB is performed normally (in a case where the number of error bits or the error bit rate is less than a threshold), the memory controller 10 updates the block difference values of the difference block DB based on the calculated determination voltages V. This process is the same as the process described in the second embodiment with reference to FIG. 21 (for example, the processes from S402 to S408).

On the other hand, in a case where the data reading from the difference block DB (hereinafter, also referred to as "error difference block DB") is not normally performed at the calculated determination voltages V (in a case where the number of error bits or the error bit rate is equal to or more than the threshold), the memory controller 10 separately performs the determination voltage tracking on the error difference block DB, acquires appropriate values of the determination voltages of the error difference block DB and updates the block difference values based on the acquired appropriate values.

According to the constitution in the embodiment, in a case where the determination voltages V of the reference block RB are updated, the difference values (the block difference values) of the difference block BLK with respect to the reference block RB are updated based on a relational expression and parameters acquired in advance. Accordingly, the number of times that the determination voltage tracking of the difference block DB is performed can be reduced, and efficiency (speed) of the update process of the determination voltages V can be improved.

Although some embodiments and modifications have been described above, the embodiments are not limited to the above examples. The above-described embodiments and modifications may be implemented in combination with each other. A part or all of the functions of the memory controller 10 may be implemented by hardware (including a circuit unit; circuitry) such as an application specific integrated circuit (ASIC), a programmable logic device (PLD), or a field programmable gate array (FPGA). Also, ordinal numbers such as "first" and "second" in the specification are for convenience of description and may be re-arranged by changing the order.

The "first difference value" in the specification does not need to be a common difference value which is commonly set for two or more word lines WL included in the same block BLK and may be any difference value which is set for one word line included in a certain block BLK. The same applies to the second difference value, the third difference value, the fourth difference value, and the like.

According to at least one embodiment described above, the memory system applies one or more determination voltages determined based on the reference value and the first common difference value to the first and second word lines in a case where whether or not the first data value is written in each of the first and second memory cells is determined, applies one or more determination voltages determined based on the reference value, the first common difference value, and the second common difference value to third and fourth word lines in a case where whether or not the first data value is written in each of the third and fourth memory cells is determined, and changes the first common difference value in a case where a first condition is satisfied. According to such a constitution, characteristics relating to data read operation can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a memory device including a first memory cell, a second memory cell, a first word line, and a second word line, the memory device being configured to write any one data value among one or more data values into each of the first memory cell and the second memory cell, the first word line being connected to the first memory cell, the second word line being connected to the second memory cell, the first memory cell being included in a first physical block, the second memory cell being included in a second physical block, and the second physical block being different from the first physical block; and
   a controller configured to instruct the memory device to apply, to the first word line, a determination voltage that is based on a first value and a first difference value in a case where it is determined whether or not a first data value that is one of the one or more data values has been written in the first memory cell, to instruct the memory device to apply, to the second word line, a determination voltage that is based on the first value, the first difference value, and a second difference value in a case where it is determined whether or not the first data value has been written in the second memory cell, and to change the first difference value in a case where a first condition is satisfied.

2. The memory system according to claim 1, wherein:
   the memory device further includes a third memory cell and a third word line, the memory device being configured to write any one data value among the one or more data values into the third memory cell, the third word line being connected to the third memory cell, and the third memory cell being included in the first physical block, and
   the controller is configured to instruct the memory device to apply, to the third word line, a determination voltage that is based on the first value and the first difference value in a case where it is determined whether or not the first data value has been written in the third memory cell.

3. The memory system according to claim 2, wherein:
   the memory device further includes a fourth memory cell and a fourth word line, the memory device being configured to write any one data value among the one or more data values into the fourth memory cell, the fourth word line being connected to the fourth memory cell, and the fourth memory cell being included in the second physical block, and
   the controller is configured to instruct the memory device to apply, to the fourth word line, a determination voltage that is based on the first value, the first difference value, and the second difference value in a case where whether or not the first data value has been written in the fourth memory cell.

4. The memory system according to claim 1, wherein:
   the memory device further includes a fifth memory cell and a fifth word line, the memory device being configured to write any one data value among the one or more data values into the fifth memory cell, the fifth word line being connected to the fifth memory cell, the fifth memory cell being included in a third physical block, and the third physical block being different from the first physical block and the second physical block,
   the controller is configured to instruct the memory device to apply, to the fifth word line, a determination voltage that is based on the first value, the first difference value, and a third difference value in a case where it is determined whether or not the first data value has been written in the fifth memory cell, and
   the third difference value is different from the second difference value in a case where the determination voltage to be applied to the fifth word line is different from the determination voltage to be applied to the second word line.

5. The memory system according to claim 4, wherein:
   the memory device further includes a sixth memory cell and a sixth word line, the memory device being configured to write any one data value among the one or more data values into the sixth memory cell, the sixth word line being connected to the sixth memory cell, the sixth memory cell being included in a fourth physical block, and the fourth physical block being different from the first physical block, the second physical block, and the third physical block,
   the first physical block, the second physical block, and the third physical block are included in a first group for which the first difference value is used, the fourth physical block is included in a second group for which a fourth difference value different from the first difference value is used, and the controller is configured to instruct the memory device to apply, to the sixth word line, a determination voltage that is based on the first value and the fourth difference value in a case where it is determined whether or not the first data value has been written in the sixth memory cell.

6. The memory system according to claim 1, wherein:

the controller is configured to refer to information in which a plurality of difference values are associated with a plurality of identification numbers, the plurality of difference values including the first difference value and the second difference value, to acquire the first difference value from the information by designating a first identification number included in the plurality of identification numbers, and to acquire the second difference value from the information by designating a second identification number included in the plurality of identification numbers.

7. The memory system according to claim 1, wherein:

the controller is configured to instruct the memory device to apply, to the first word line, a determination voltage that is based on the first value, the first difference value, and a fifth difference value in a case where it is determined whether or not the first data value has been written in the first memory cell, and to instruct the memory device to apply, to the second word line, a determination voltage that is based on the first value, the first difference value, and a sixth difference value in a case where it is determined whether or not the first data value has been written in the second memory cell, and the sixth difference value is different from the fifth difference value.

8. The memory system according to claim 1, wherein each of the number of bits which indicates the first difference value and the number of bits which indicates the second difference value is smaller than the number of bits which indicates the first value.

9. The memory system according to claim 1, wherein:

the controller is configured to refer to first information in which a plurality of difference values are associated with a plurality of first type identification numbers and second information in which a plurality of difference values are associated with a plurality of second type identification numbers, the plurality of difference values in the first information include the first difference value, and the plurality of difference values in the second information include the second difference value, to acquire the first difference value from the first information by designating one identification number included in the plurality of first type identification numbers, to acquire the second difference value from the second information by designating one identification number included in the plurality of second type identification numbers, and the number of bits which indicates each of the plurality of second type identification numbers is smaller than the number of bits which indicates each of the plurality of first type identification numbers.

10. The memory system according to claim 1, wherein the controller is configured to change the second difference value without changing the first difference value in a case where a second condition different from the first condition is satisfied.

11. The memory system according to claim 1, wherein:

the first physical block includes a plurality of memory cells which include the first memory cell, and the controller is configured to perform a first determination for at least part of the plurality of memory cells in the first physical block in a case where a predetermined condition is satisfied, to change the first difference value in a case where a result of the first determination satisfies the first condition, and to change the second difference value in a case where the result of the first determination does not satisfy the first condition.

12. The memory system according to claim 11, wherein the first condition includes that the number of times of writing to the at least part of the plurality of memory cells in the first physical block is equal to or greater than a threshold.

13. The memory system according to claim 11, wherein the first condition includes that the number of error bits or an error bit rate relating to the at least part of the plurality of memory cells in the first physical block is equal to or greater than a threshold.

14. The memory system according to claim 11, wherein:

the controller is configure to read data from the first physical block and the second physical block in this order, and to perform the first determination based on the number of error bits or an error bit rate acquired in a read operation for the first physical block in a case where the number of error bits or the error bit rate acquired in a read operation for the second physical block is equal to or greater than a threshold.

15. The memory system according to claim 14, wherein the controller is configured to change a read order in response to receiving a first command which indicates of reading data from the second physical block and a second command which indicates of reading data from the first physical block from a host device in an order of the first command and the second command, and to read data from the first physical block and the second physical block in this order.

16. The memory system according to claim 11, wherein:

the memory device includes a fifth physical block and a sixth physical block each of which includes a plurality of memory cells, and the controller is configured, in a case where the number of times at which one or more of the plurality of memory cells of the fifth physical block becomes a leading address of a read destination address satisfies a predetermined condition, to move data stored in the fifth physical block to the sixth physical block in a garbage collection, and to perform the first determination based on the number of error bits or an error bit rate acquired in a read operation for the sixth physical block.

17. The memory system according to claim 1, wherein:

the controller is configured to refer to information in which a relationship between a determination voltage for the first physical block and a determination voltage for the second physical block is acquired by statistics regression model, and in a case where the first difference value is changed, to derive an appropriate value for the second difference value based on the changed first difference value and the information, and to change the second difference value using the derived appropriate value.

18. A method for controlling a memory system including a memory device,
- the memory device including a first memory cell, a second memory cell, a first word line, and a second word line, the memory device being configured to write any one data value among one or more data values into each of the first memory cell and the second memory cell, the first word line being connected to the first memory cell, the second word line being connected to the second memory cell, the first memory cell being included in a first physical block, the second memory cell being included in a second physical block, and the second physical block being different from the first physical block,
- the method comprising:
- instructing the memory device to apply, to the first word line, a determination voltage that is based on a first value and a first difference value in a case where it is determined whether or not a first data value that is one of the one or more data values has been written in the first memory cell;
- instructing the memory device to apply, to the second word line, a determination voltage that is based on the first value, the first difference value, and a second difference value in a case where it is determined whether or not the first data value has been written in the second memory cell; and,
- changing the first difference value in a case where a first condition is satisfied.

19. The method for controlling the memory system according to claim 18, wherein:
- the memory device further includes a third memory cell and a third word line, the memory device being configured to write any one data value among the one or more data values into the third memory cell, the third word line being connected to the third memory cell, and the third memory cell being included in the first physical block,
- the method further comprising:
- instructing the memory device to apply, to the third word line, a determination voltage that is based on the first value and the first difference value in a case where it is determined whether or not the first data value has been written in the third memory cell.

20. The method for controlling the memory system according to claim 18, wherein:
- the memory device further includes a fourth memory cell and a fourth word line, the memory device being configured to write any one data value among the one or more data values into the fourth memory cell, the fourth word line being connected to the fourth memory cell, the fourth memory cell being included in a third physical block, and the third physical block being different from the first physical block and the second physical block,
- the method further comprising:
- instructing the memory device to apply, to the fourth word line, a determination voltage that is based on the first value, the first difference value, and a third difference value in a case where it is determined whether or not the first data value has been written in the fourth memory cell, the third difference value being different from the second difference value in a case where the determination voltage to be applied to the fourth word line is different from the determination voltage to be applied to the second word line.

* * * * *